US008688428B2

(12) United States Patent
Hotta

(10) Patent No.: US 8,688,428 B2
(45) Date of Patent: Apr. 1, 2014

(54) PERFORMANCE EVALUATION DEVICE, PERFORMANCE EVALUATION METHOD AND SIMULATION PROGRAM

(75) Inventor: Masumi Hotta, Tokyo (JP)

(73) Assignee: Fujitsu Semiconductor Limited, Yokohama (JP)

(*) Notice: Subject to any disclaimer, the term of this patent is extended or adjusted under 35 U.S.C. 154(b) by 242 days.

(21) Appl. No.: 12/636,295

(22) Filed: Dec. 11, 2009

(65) Prior Publication Data

US 2010/0161305 A1 Jun. 24, 2010

(30) Foreign Application Priority Data

Dec. 18, 2008 (JP) ................................ 2008-322807

(51) Int. Cl.
*G06F 17/50* (2006.01)
*G06F 7/48* (2006.01)
*G06G 7/60* (2006.01)

(52) U.S. Cl.
USPC .................. 703/17; 703/16; 703/18; 703/19; 703/20; 703/21

(58) Field of Classification Search
None
See application file for complete search history.

(56) References Cited

U.S. PATENT DOCUMENTS

| | | | | | |
|---|---|---|---|---|---|
| 5,881,267 | A | * | 3/1999 | Dearth et al. | 703/27 |
| 6,078,742 | A | * | 6/2000 | Chow | 703/25 |
| 6,154,801 | A | * | 11/2000 | Lowe et al. | 710/119 |
| 6,377,912 | B1 | * | 4/2002 | Sample et al. | 703/28 |
| 7,050,958 | B1 | * | 5/2006 | Bortfeld et al. | 703/15 |
| 7,778,815 | B2 | * | 8/2010 | Pasricha et al. | 703/22 |
| 7,856,346 | B2 | * | 12/2010 | Nightingale et al. | 703/15 |
| 2003/0110338 | A1 | * | 6/2003 | Wang et al. | 710/305 |
| 2005/0071145 | A1 | * | 3/2005 | Sakiyama | 703/19 |
| 2005/0228627 | A1 | * | 10/2005 | Bellantoni et al. | 703/13 |
| 2009/0210597 | A1 | * | 8/2009 | Terashima et al. | 710/110 |

FOREIGN PATENT DOCUMENTS

JP 2004-21907 1/2004

OTHER PUBLICATIONS

Parischa et al. "High Level Design Space Exploration of Shared Bus Communication Architectures", Mar. 2004.*
Wingard, Drew. "MicroNetwork-Based Integration for SOCs", 2001.*
Flynn, David. "AMBA: Enabling Reusable On-Chip Designs", 1997.*
Siripokarpirom, Rawat. "Platform Development for Run-Time Reconfigurable Co-Emulation", IEEE International Workshop on Rapid System Prototyping 2006.*
Caldari, et al. Transaction-Level Models for AMBA Bus Architecture Using SystemC 2.0, IEEE 2003.*

* cited by examiner

*Primary Examiner* — Shambhavi Patel
(74) *Attorney, Agent, or Firm* — Staas & Halsey LLP

(57) ABSTRACT

A performance evaluation device includes: a control timing model unit for outputting a timing for inputting a control signal input/output between plural function blocks contained in a simulation model corresponding to a hardware; a control signal transfer period calculation unit for calculating a transfer period of the control signal between the plural function blocks in accordance with the timing for inputting the control signal; a data timing model unit for outputting a timing for inputting a data signal corresponding to the control signal, which is input/output between the plural function blocks; and a data signal transfer period calculation unit for calculating a transfer period of the data signal between the plural function blocks in accordance with the timing for inputting the data signal.

10 Claims, 16 Drawing Sheets

FIG. 1
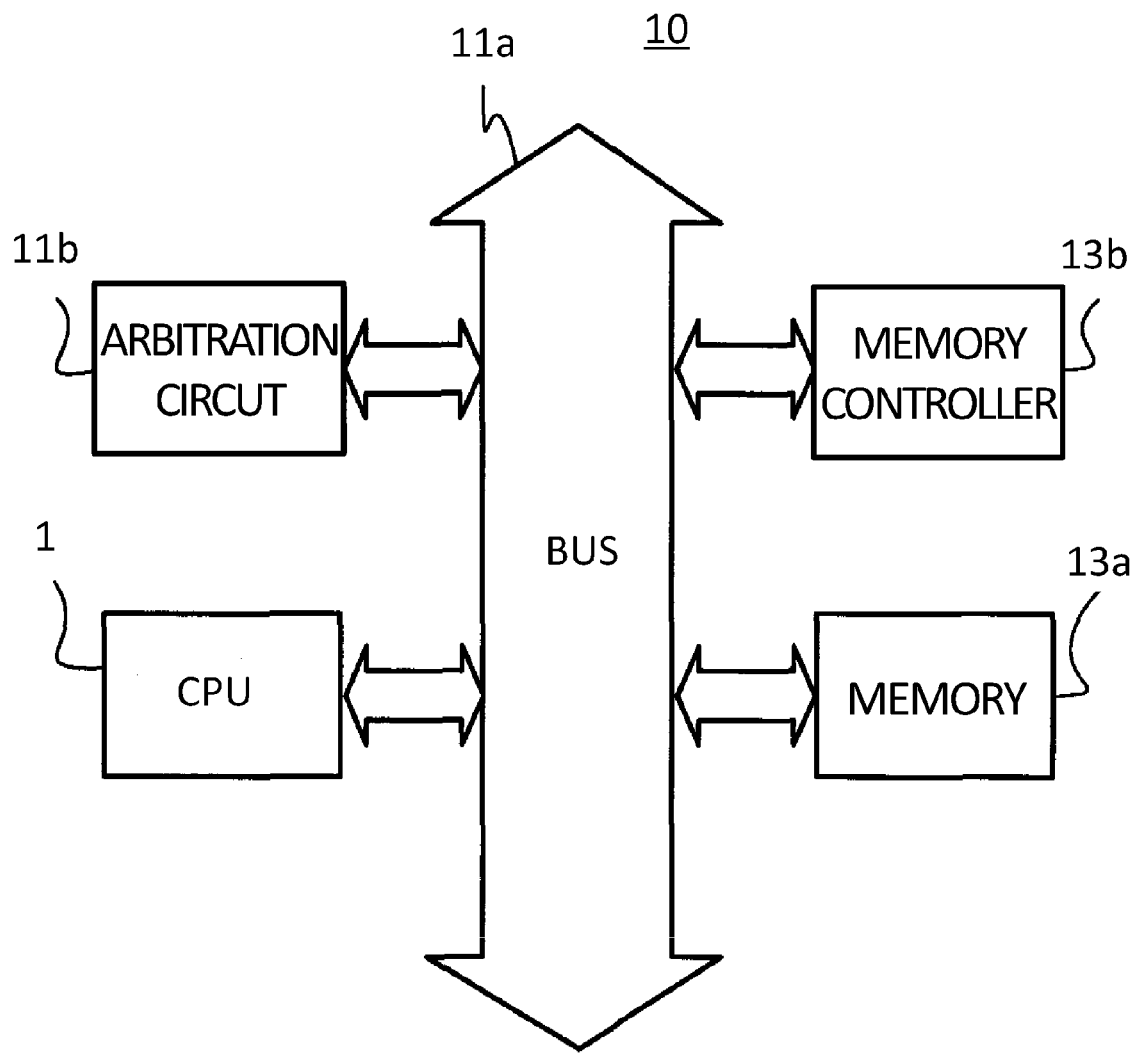
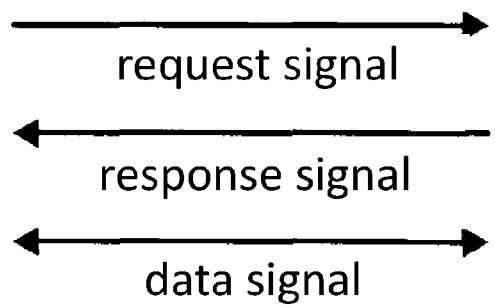

FIG. 6

| | Factors that determines the time period in writing process |
|---|---|
| Δtw1 | Δtw1 changes depending on presence/absence of the conflict on the bus (fixed value, in case of absence of conflict) |
| Δtw2 | Δtw2 is set to the fixed value. |
| Δtw3 | Δtw3 changes depending on presence/absence of the conflict on the bus (fixed value, in case of absence of conflict) |
| Δtw4 | Δtw4 is obtained by the data size information × the process period per data. |
| Δtw5 | Δtw5 is obtained by the data size information × the transmission period per data. |
| Δtw6 | Δtw6 is obtained by the data size information × writing time per data. |
| Δtw7 | Δtw7 is set to the fixed value. |

FIG. 8A

| | | |
|---|---|---|
| 181 — request | | |
| 182 — check | | true |
| 183 — read | 1000 | 3 |
| 184 — acknowledge | | |
| 185 — check | | true |

FIG. 8B

| | | |
|---|---|---|
| 186 — send | 1000 | 3 |
| 187 — send | 1000 | 3 |
| 188 — EOD | | |

FIG. 8C

| | | | |
|---|---|---|---|
| 190 — read | 1000 | 3 | |
| 191 — data | 5 | 10 | 2 |

FIG. 10

| | Factors that determines the time period in reading process |
|---|---|
| Δtr1 | Δtr1 changes depending on presence/absence of the conflict on the bus (fixed value, in case of absence of conflict) |
| Δtr2 | Δtr2 is set to the fixed value. |
| Δtr3 | Δtr3 changes depending on presence/absence of the conflict on the bus (fixed value, in case of absence of conflict) |
| Δtr4 | Δtr4 is set to the fixed value. |
| Δtr5 | Δtr5 is set to the fixed value. |
| Δtr6 | Δtr6 is obtained by the data size information × reading time per data. |
| Δtr7 | Δtr7 is obtained by the data size information × the transmission period per data. |

FIG. 11
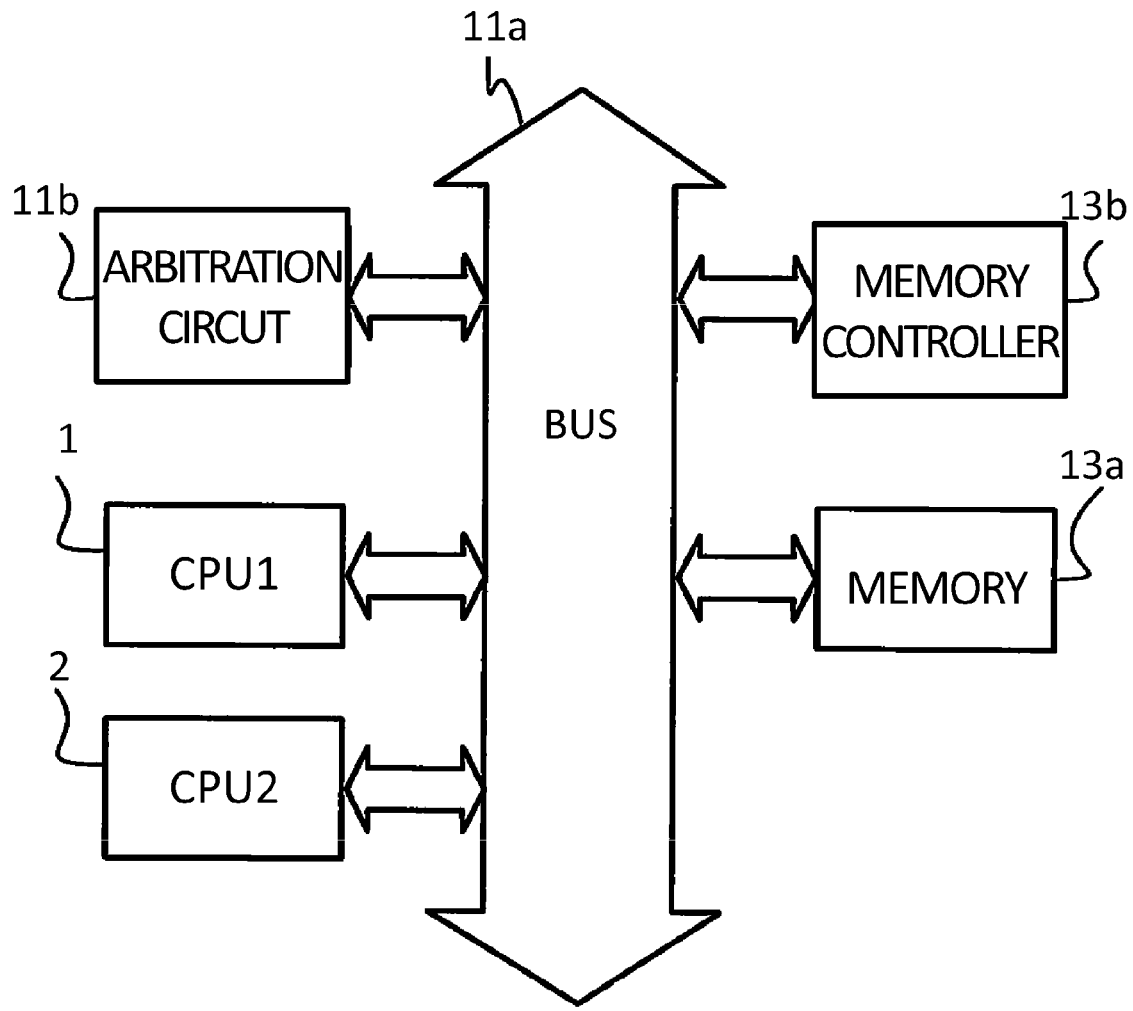
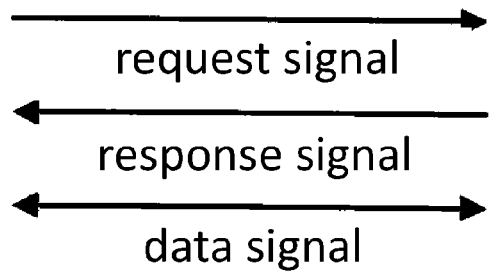

FIG. 13A

| | | | |
|---|---|---|---|
| 271 | request | 1 | |
| 272 | check | | false |
| 273 | check | | true |
| 274 | write | 1000 | 3 |
| 275 | acknowledge | | |
| 276 | check | | true |

FIG. 13B

| | | | |
|---|---|---|---|
| 371 | request | 2 | |
| 372 | check | | true |
| 373 | write | 1000 | 3 |
| 374 | acknowledge | | |
| 375 | check | | false |
| ⋮ | | | |
| 376 | check | | false |
| 377 | check | | true |

FIG. 13C

| | | |
|---|---|---|
| 281 | send | 3 |
| 282 | EOD1 | |
| 381 | send | 3 |
| 382 | EOD2 | |

FIG. 13D

| | | | | | | |
|---|---|---|---|---|---|---|
| 291 | write | 1000 | 3 | 5 | 10 | 2 |
| 391 | write | 1000 | 3 | 5 | 10 | 2 |

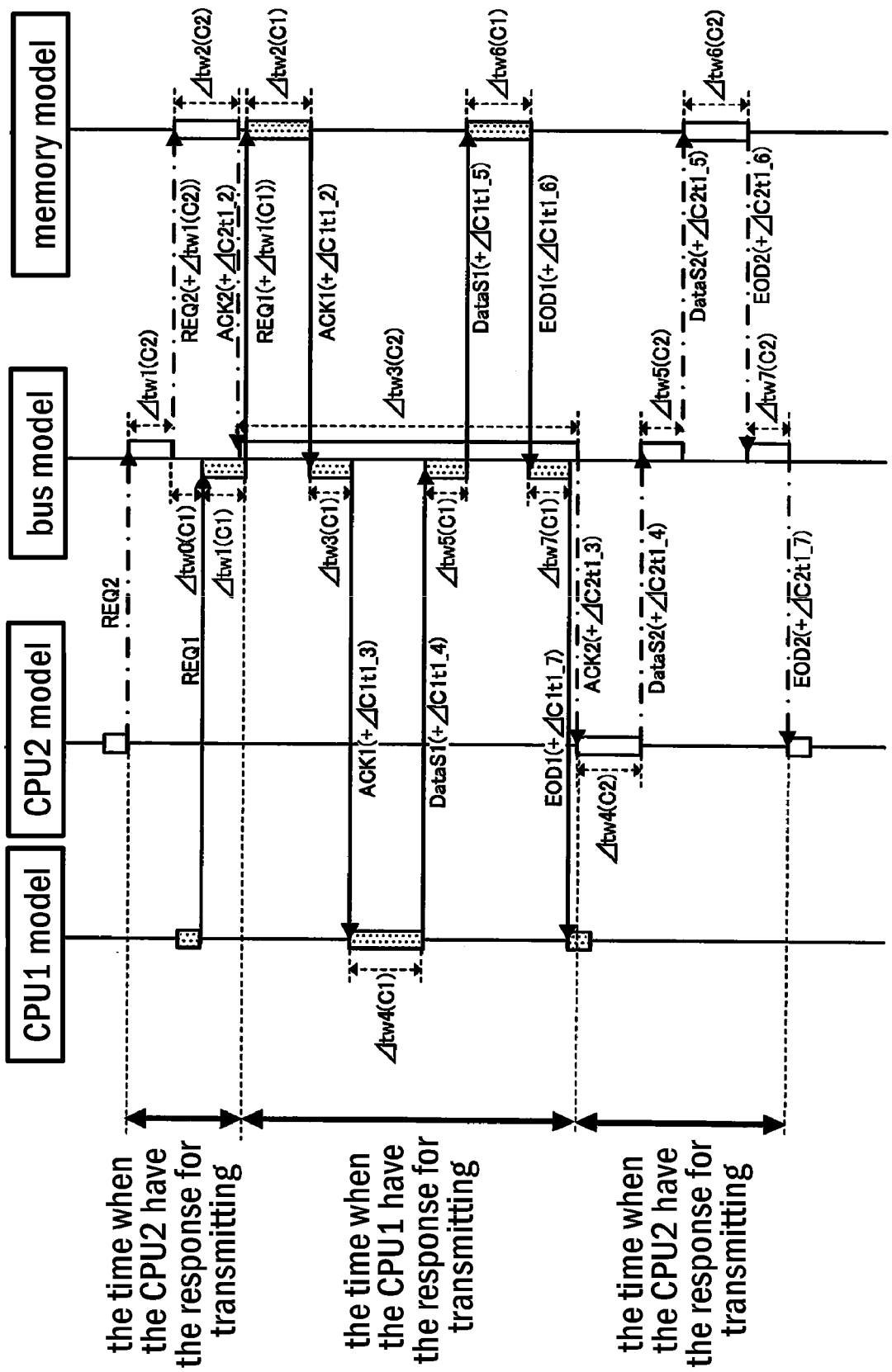

FIG. 15

| | CPU1 model (invent priority is high) | CPU2 model (invent priority is low) |
|---|---|---|
| Δtw1 | Δtw1 is set to the fixed value. | Δt2(c1)−Δt0(c1) |
| Δtw2 | Δtw2 is set to the fixed value. | |
| Δtw3 | Δtw3 is set to the fixed value. | The sum of Δt2(c1)〜Δt7(c1). |
| Δtw4 | Δtw4 is obtained by the data size information × the process period per data. | |
| Δtw5 | Δtw5 is obtained by the data size information × the transmission period per data. | |
| Δtw6 | Δtw6 is obtained by the data size information × writing time per data. | |
| Δtw7 | Δtw7 is set to the fixed value. | |

PERFORMANCE EVALUATION DEVICE, PERFORMANCE EVALUATION METHOD AND SIMULATION PROGRAM

CROSS REFERENCE TO RELATED APPLICATION

This application is based upon and claims the benefit of priority from the prior Japanese Patent Application No. 2008-322807 filed on Dec. 18, 2008, the entire contents of which are incorporated herein by reference.

FIELD

The embodiment discussed herein are related to a performance evaluation device, a performance evaluation method and a simulation program for evaluating hardware performance using a simulation model.

BACKGROUND

In General, design of hardware with a logic circuit and the like is time-consuming. Therefore, a simulation model of hardware is fabricated in advance for simulation and evaluation of the hardware so as to develop the software in advance, avoid the specification failure, and check the performance.

Specifically, the simulation is conducted by fabricating an operation model for each function block such as a processor and a bus included in the hardware, and integrating the operation models to form a simulation model for simulating the entire operation of the hardware. Examples of the operation model include a clock model, a transaction model, a function model and the like. Each of those operation models has a different abstraction level as below.

The clock model is the operation model that describes the operation at the signal level for each clock, which corresponds to the hardware operation at the clock level. The clock model may be used mainly for verifying the operation in detail. The transaction model is the operation model that describes the operation for a single process (transaction) expressed by plural signals, and used for verifying the entire operation of the hardware. The function model is the operation model that describes the operation with respect to input data.

When the hardware performance is evaluated, it is requested to verify many functions with high precision at high speed. However, the hardware performance evaluation has a trade-off relationship between the accuracy and speed, that is, efforts to enhance the accuracy may decelerate the operation speed. In the case where all the function blocks are clock modeled to enhance the accuracy, calculation is required for every clock, thus requiring an enormous amount of time for the performance evaluation. Further, when all the function blocks are modeled, the amount of modeling becomes very large, resulting in difficulty in realizing early fabrication of the model. Therefore, models having different abstraction levels may be combined to conduct the simulation when evaluating only a part of the functions of the hardware in detail. Patent Document 1 has proposed the technology for separately evaluating the transaction model and the function model among the models, as one of the methods for conducting the aforementioned simulation.

Patent Document 1

Japanese Laid-open Patent Publication No. 2004-21907

The hardware to be simulated allows control signals and data signals to be input/output. The accuracy of the hardware performance evaluation using the simulation will be deteriorated unless the respective timings for inputting/outputting the data signals and the control signals are considered.

SUMMARY

According to an aspect of the embodiments, the device includes a control timing model unit for outputting a timing for inputting a control signal input/output between plural function blocks contained in a simulation model corresponding to a hardware, a control signal transfer period calculation unit for calculating a transfer period of the control signal between the plural function blocks in accordance with the timing for inputting the control signal, a data timing model unit for outputting a timing for inputting a data signal corresponding to the control signal, which is input/output between the plural function blocks, and a data signal transfer period calculation unit for calculating a transfer period of the data signal between the plural function blocks in accordance with the timing for inputting the data signal.

The object and advantages of the embodiments will be realized and attained by means of the elements and combinations particularly pointed out in the claims.

It is to be understood that both the foregoing general description and the following detailed description and are exemplary and explanatory and are not restrictive of the embodiments, as claimed.

BRIEF DESCRIPTION OF DRAWINGS

FIG. 1 is a block diagram depicting an example of a hardware structure to be simulation modeled according to a first embodiment;

FIG. 6 is a table representing factors based on which the time information is determined upon data writing process;

FIGS. 8A to 8C depicts event examples in the respective model operation means upon data reading process;

FIG. 10 is a table representing factors based on which the time information is determined upon data reading process;

FIG. 11 is a block diagram depicting an example of a hardware structure to be simulation modeled according to a second embodiment;

FIGS. 13A to 13D depict event examples in the respective model operation means upon data writing process;

FIG. 14 is a timing chart illustrating an operation of the simulation model upon data writing process;

FIG. 15 is a table representing factors based on which the time information is determined upon data writing process.

DESCRIPTION OF EMBODIMENTS

Figure 2:
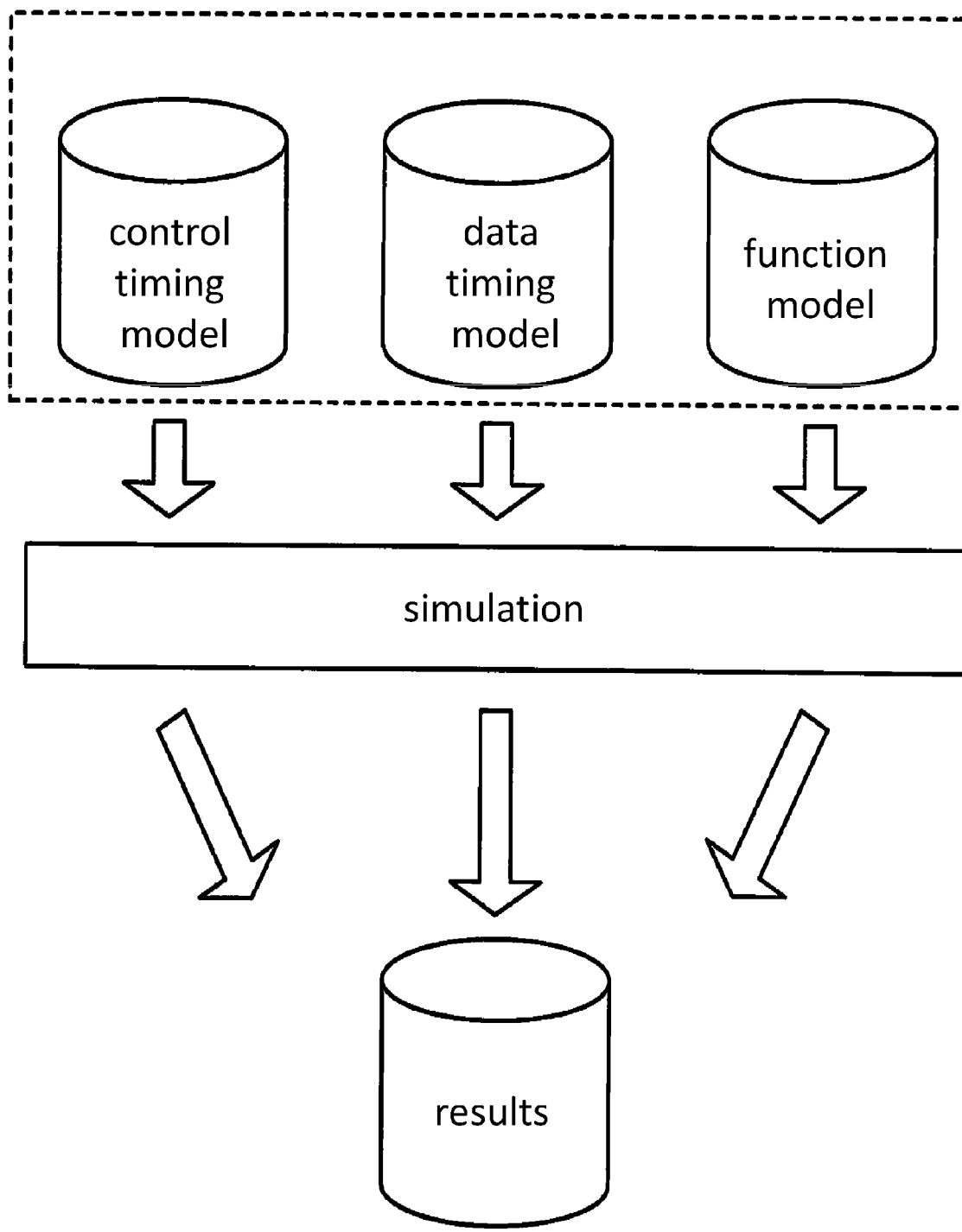
FIG. 2 is a view schematically depicting a simulation method using the simulation model according to the first embodiment.

An example of an embodiment will be described referring to the drawings hereinafter.

First Embodiment

A simulation model according to a first embodiment will be described referring to FIGS. 1 to 3.

FIG. 1 is a block diagram illustrating a structure example of hardware to be simulation modeled according to the first embodiment.

A hardware 10 to be simulation modeled according to the first embodiment includes a CPU (Central Processing Unit) 1, a bus 11a, an arbitration circuit 11b, a memory 13a, and a memory controller 13b. The CPU 1, the arbitration circuit 11b, the memory 13a and the memory controller 13b are connected with one another via the bus 11a.

The CPU 1 inputs/outputs control/data signals from/to the memory controller 13b via the bus 11a. The memory controller 13b inputs/outputs the control/data signals from/to the CPU 1 via the bus 11a, and writes data to the memory 13a or reads the data from the memory 13a. The arbitration circuit 11b is employed for adjusting conflict among control signals on the bus 11a. Upon reception of permission with respect to the transmission from the arbitration circuit 11b, the CPU 1 or the memory controller 13b transmits the control signal to the destination via the bus 11a.

The actual process executed in the hardware 10 to be simulation modeled, that is, the process for writing data into the memory 13a and the process for reading the data from the memory 13a will be briefly described.

In any of the processes for data writing and data reading, the CPU 1 inputs/outputs the control signal (request signal and response signal) from/to the memory controller 13b via the bus 11a.

For example, the CPU 1 transmits the request signal for writing data into the memory 13a, or the request signal for reading the data from the memory 13a to the memory controller 13b via the bus 11a. Upon reception of the request signal, the memory controller 13b transmits the response signal to the CPU 1 via the bus 11a.

More For example, the CPU 1 transmits a signal indicating a transmission authorization request to the arbitration circuit 11b before transmitting the request signal to the memory controller 13b. Upon reception of the signal indicating permission of the transmission authorization from the arbitration circuit 11b, the CPU 1 transmits the request signal to the memory controller 13b via the bus 11a. Upon reception of the data writing request signal or the data reading request signal from the CPU 1, the memory controller 13b generates the response signal, and transmits the signal indicating the transmission authorization request to the arbitration circuit 11b. Upon reception of the signal indicating permission of the transmission authorization from the arbitration circuit 11b, the memory controller 13b transmits the generated response signal to the CPU 1 via the bus 11a.

Upon reception of the response signal from the memory controller 13b, the CPU 1 inputs/outputs the data signals from/to the memory controller 13b via the bus 11a.

For example, when data are written into the memory 13a, the CPU 1 transmits the data signal which contains data to the memory controller 13b. Upon reception of the data signal which contains the data, the memory controller 13b writes the data into the memory 13a. When the data writing into the memory 13a is finished, the memory controller 13b transmits a process end signal indicating the end of the process to the CPU 1, thus finishing the data writing process into the memory 13a.

Meanwhile, when the data are read from the memory 13a, the CPU 1 transmits the data signal which contains data address and data size to the memory controller 13b. Upon reception of the data signal which contains the data address and the data size, the memory controller 13b reads the data from the memory 13a based on the data address and the data size, and transmits the read data to the CPU 1. When transmission of the data read from the memory 13a to the CPU 1 is finished, the memory controller 13b transmits the process end signal to the CPU 1, thus terminating the data reading process from the memory 13a.

FIG. 2 illustrates a simulating method of the simulation model according to the first embodiment.

Referring to FIG. 2, the simulation model according to the first embodiment includes at least a control timing model, a data timing model and a function model. The control timing model and the data timing model perform transaction modeling. The number of modeling steps of the transaction model is smaller than that of the clock model, thus fabricating the model at the earlier stage. The function model is optional. The performance may be evaluated based on results of simulating the two models of the control timing model and the data timing model without using the function model. The control timing model is obtained by modeling the input/output timing of the control signal in the function block such as the CPU 1 and the memory controller 13b. The data timing model is obtained by modeling the timing of input/output of the data signal in the function block. The control timing model and the data timing model are used for evaluating the time for inputting/outputting the control signal/data signal between the function blocks.

The function model is obtained by modeling the operation when inputting the data contained in the data signal to the function block or when outputting the data from the function block. The function model is used for evaluating whether or not the data are accurately passed between the function blocks.

The simulation model according to the first embodiment is used for simulating the control timing model, the data timing model, and the function model, respectively. The respective results are integrated to evaluate the hardware. The specific explanation will be described hereinafter.

Figure 3:
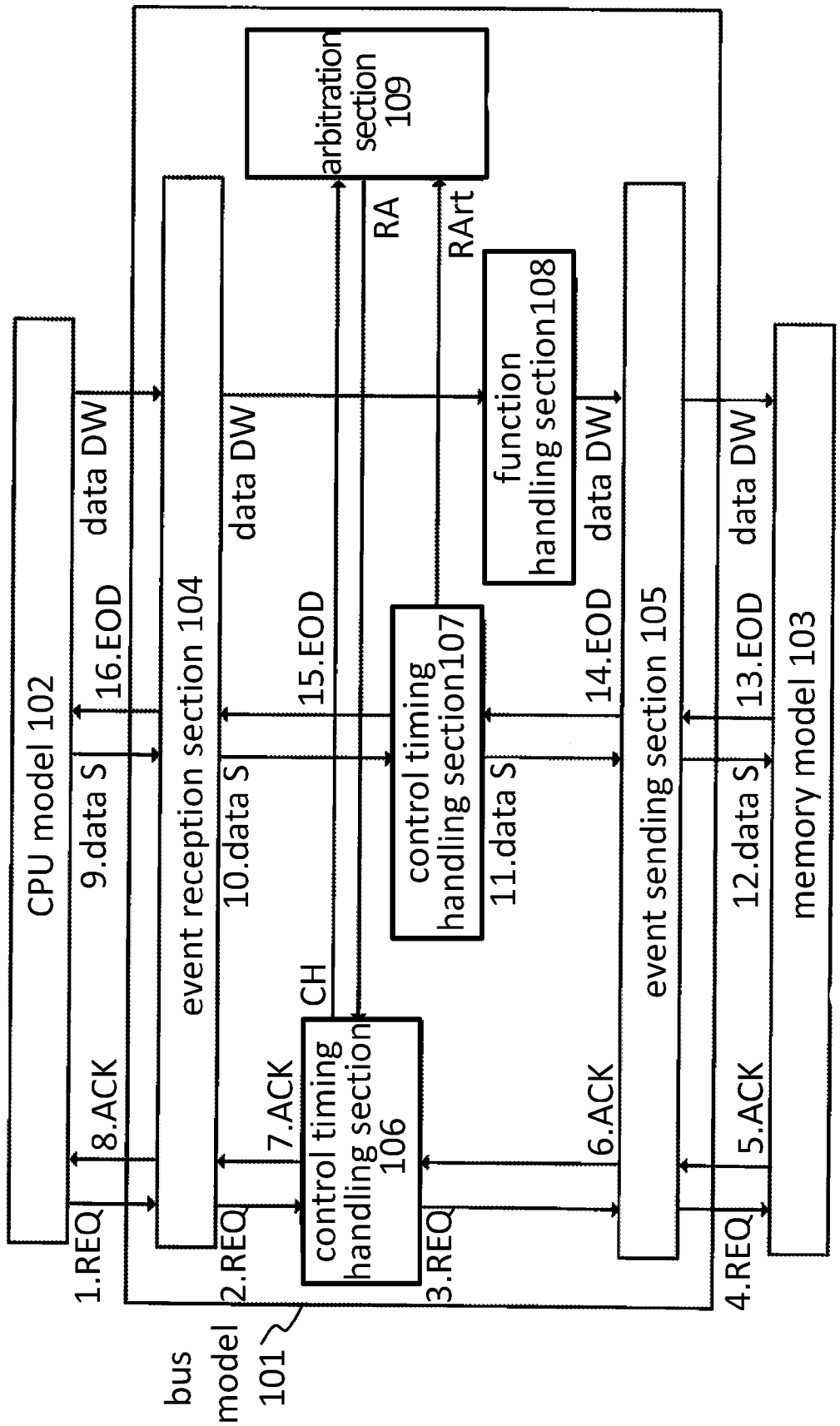
FIG. 3 is a block diagram of an example of a structure of the simulation model according to the first embodiment.

FIG. 3 is a block diagram illustrating an example of the structure of the simulation model according to the first embodiment.

The simulation model according to the first embodiment for simulating the hardware 10 depicted in FIG. 1 is provided as the program which runs on the simulator such as the computer which includes at least an operation section and a data storage section. The program of the simulation model runs on the simulator to allow the respective components formed by modeling the respective function blocks of the hardware 10 to be operated as the thread, thus inputting/outputting events. The performance evaluation device may be realized by running the program of the simulation model on the simulator.

The simulator may be structured to perform the simulation by reading the program corresponding to the simulation model stored in the data storage section to the operation section so as to be executed, and to display the simulation results on the display section connected to the simulator. The program corresponding to the simulation model stored in the data storage section may be loaded from the recording medium such as CD-ROM (CD-R, CD-RW), MO, DVD (Digital Versatile Disk), and a memory card, or the external data storage device connectable with the plug and play into the data storage section. In the case where the simulator includes the communication device connectable to the network, the program may be downloaded via the network. The processing unit such as the CPU and MPU may be employed as the operation section, and a general data storage unit such as ROM, RAM and HDD (Hard Disk Drive) may be employed as the data storage section.

The simulation model according to the first embodiment includes a bus model 101, a CPU model 102, and a memory model 103. For example, the bus model 101 is formed by modeling the bus 11a and the arbitration circuit 11b of the hardware 10. The CPU model 102 is formed by modeling the CPU 1 of the hardware 10. The memory model 103 is formed by modeling the memory 13a and the memory controller 13b of the hardware 10.

The CPU model 102 and the memory model 103 of the simulation model according to the first embodiment mainly input/output an event indicating the control signal (control event) and an event indicating the data signal (data event) via the bus model 101. Referring to FIG. 3, solid-line arrow represents the flow of the event upon simulation of the data writing process.

The bus model 101 includes an event reception section 104, an event sending section 105, a control timing handling section 106, a data timing handling section 107, a function handling section 108 and an arbitration section 109. The control timing handling section 106, the data timing handling section 107, and the function handling section 108 constitute model operation means of the bus model 101.

The event reception section 104 receives an event from the CPU model 102, and analyzes the content of the event. The event reception section 104 transmits the event to any of the model operation means including the control timing handling section 106, the data timing handling section 107, and the function handling section 108 depending on the content of the event. For example, the event transmitted from the CPU model 102 to the event reception section 104 has an identifier preliminarily added for identifying the model operation means as the destination. Based on the identifier, the event reception section 104 transmits the received event to the identified model operation means.

The event reception section 104 transmits the control event indicating the control signal (request signal and response signal) among the events received from the CPU model 102 to the control timing handling section 106. The event reception section 104 transmits the data event which does not contain the data but contains the data size information (data size information event) among those received from the CPU model 102 to the data timing handling section 107. Meanwhile, the event reception section 104 transmits the data event which contains the data (data information event) among the events received from the CPU model 102 to the function handling section 108.

The event reception section 104 receives events from the control timing handling section 106, the data timing handling section 107, and the function handling section 108, respectively to transmit the received events to the CPU model 102.

The control timing handling section 106 is the model operation means formed by modeling the timing for inputting/outputting the control signal to be passed between the CPU 1 and the memory controller 13b of the hardware 10 via the bus 11a. For example, the control timing handling section 106 passes the control event between the CPU model 102 and the memory model 103. Upon passing of the control event, the control timing handling section 106 requires authorization to send the control event to the destination to the arbitration section 109 (transmission authorization request). Upon reception of the transmission authorization from the arbitration section 109, the control timing handling section 106 transmits the control event to the destination. The control event is input/output between the CPU model 102 and the memory model 103 via the control timing handling section 106 to realize the control timing model.

The data timing handling section 107 is the model operation means formed by modeling the input/output operation of the data signal between the CPU 1 and the memory controller 13b via the bus 11a. For example, the data timing handling section 107 passes the data size information event between the CPU model 102 and the memory model 103. The data size information event is input/output via the data timing handling section 107 between the CPU model 102 and the memory model 103 to realize the data timing model formed by modeling the timing for inputting/outputting the data signal.

The function handling section 108 is the model operation means formed by modeling the operation when the data of the data signal are input to the CPU 1 or the memory 13a. For example, the function handling section 108 passes the data information event between the CPU model 102 and the memory model 103. The data information event is input/output between the CPU model 102 and the memory model 103 via the function handling section 108 to realize the function model formed by modeling the operation when the data contained in the data signal are input from/output to the memory.

The arbitration section 109 is formed by modeling the arbitration circuit 11b of the hardware 10. Upon reception of the transmission authorization request from the control timing handling section 106, the arbitration section 109 determines whether or not the transmission authorization is given to the control timing handling section 106. If the transmission authorization is given to the control timing handling section 106, the arbitration section 109 sends notification to give the transmission authorization. If the transmission authorization is not given, the notification not to give the transmission authorization is sent. For example, upon reception of the transmission authorization request from the control timing handling section other than the control timing handling section 106, the arbitration section 109 determines that conflict exists on the bus. In the above case, the arbitration section 109 gives the transmission authorization to the control timing handling section for transmitting the control event with the highest priority. The simulation model according to the first embodiment is used for simulating the hardware having the single CPU connected to the bus. It may be assumed that the conflict does not exist in the bus. Upon reception of the transmission authorization request from the control timing handling section 106, the arbitration section 109 of the simulation model according to the first embodiment sends the notification to give the transmission authorization to the subject control timing handling section 106.

The event sending section 105 receives events from the control timing handling section 106, the data timing handling section 107, and the function handling section 108, respectively, and sends the received events to the memory model 103. The event sending section 105 receives the event from the memory model 103, and depending on the content of the event, transmits the event to any of the model operation means including the control timing process unit 106, the data timing handling section 107, and the function handling section 108. The event sending section 105 transmits the control event to the control timing handling section 106, the data size information event to the data timing handling section 107, and the data information event to the function handling section 108, for example.

As described above, in the simulation model according to the first embodiment, the bus model 101 is provided with the model operation means including the control timing handling section 106, the data timing handling section 107, and the function handling section 108. The control event is input/output between the CPU model 102 and the memory model 103 via the control timing handling section 106 so as to realize the control timing model. The data size information event is input/output between the CPU model 102 and the memory model 103 via the data timing handling section 107 so as to realize the data timing model. The data information event is input/output between the CPU model 102 and the memory model 103 via the function handling section 108 so as to realize the function model.

The simulation model according to the first embodiment includes the control timing model formed by modeling the timing for inputting/outputting the control signal, and the data timing model formed by modeling the timing for inputting/outputting the data signal. This makes it possible to allow the performance evaluation in consideration of each timing for inputting/outputting the data signal and the control signal, thus enhancing the accuracy of the performance evaluation. The operation of the simulation model will be described using the example for simulating the data writing process into the memory and the data reading process from the memory.

(Process for Writing Data to Memory)

The operation of the simulation model upon simulation of the data writing of the CPU 1 into the memory 13a via the bus 11a will be described referring to FIGS. 3, and 4A to 4C. Referring to FIG. 3, the solid-line arrow denotes the flow of the event when simulating the data writing process. Alphabetical letters by the base point of the solid-line arrow denotes the code of the event upon simulation of the data writing process. The figure by the side of the alphabetical letters denotes the order for inputting/outputting the event via the control timing handling section 106 and the data timing handling section 107.

Figure 4A:
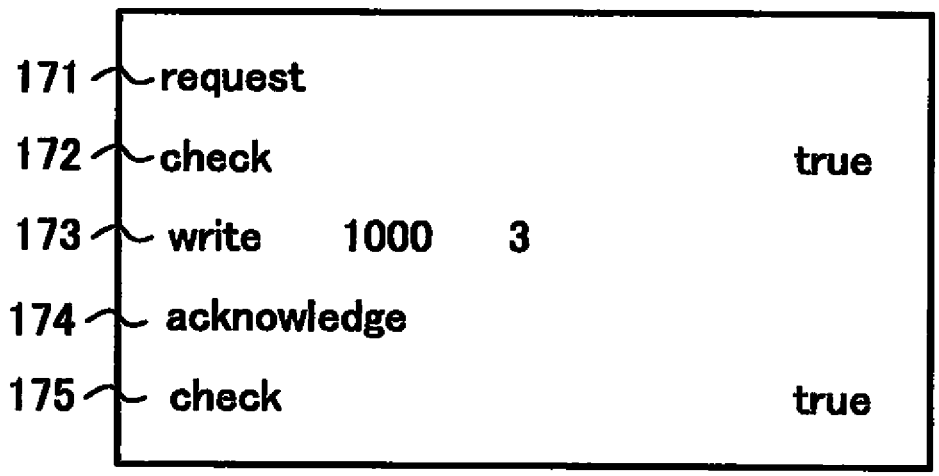
FIGS. 4A to 4C depict event examples in the respective model operation means upon data writing process.
Figure 4B:
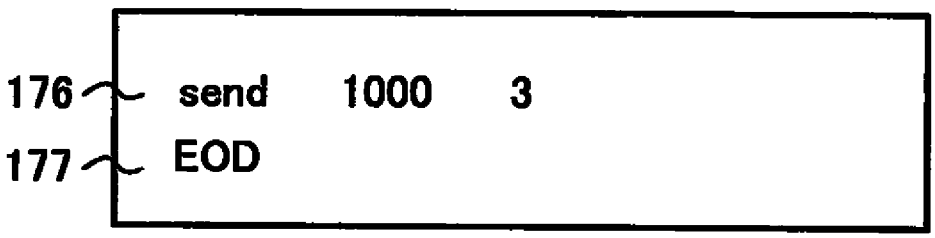
Figure 4C:
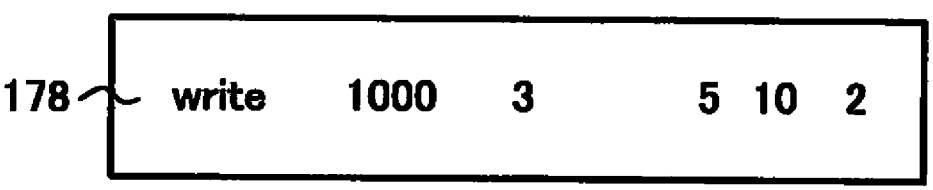

FIGS. 4A to 4C depict examples of the events when simulating the data writing process in the control timing handling section 106, the data timing handling section 107, and the function handling section 108, respectively.

FIG. 4A illustrates the example of the event in the control timing handling section 106. Statements at the left and right ends of FIG. 4A respectively denote events and return values with respect to the events.

Referring to FIG. 3, the CPU model 102 transmits a request event REQ indicating the data writing request to the bus model 101. For example, the CPU model 102 transmits the events represented by "request" 171 and "write" 173 depicted in FIG. 4A as the request event REQ to the event reception section 104. The event reception section 104 in the bus model 101 transmits the request event REQ received from the CPU model 102 to the control timing handling section 106.

Upon reception of the request event REQ represented by "request" 171 depicted in FIG. 4A, the control timing handling section 106 sends the transmission authorization request to the arbitration section 109. For example, the control timing handling section 106 transmits a transmission authorization request event CH represented by "check" 172 depicted in FIG. 4A to the arbitration section 109.

Upon reception of the transmission authorization request event CH from the control timing handling section 106, the arbitration section 109 determines whether or not the transmission authorization is given to the control timing handling section 106, and transmits the determination result to the control timing handling section 106 as the notification event RA. For example, if the transmission authorization is given to the control timing handling section 106, the arbitration section 109 transmits return value of "true" indicating that the "transmission authorization" is permitted as the notification event RA. Meanwhile, if the transmission authorization is not given to the control timing handling section 106, the arbitration section 109 transmits the return value of "false" indicating that the transmission authorization is not given as the notification event RA. As described above, it is assumed that the conflict does not exist on the bus in the first embodiment, the arbitration section 109 transmits the return value of "true" as the notification event RA to the control timing handling section 106.

Upon reception of the return value of "true" from the arbitration section 109, the control timing handling section 106 transmits the request event REQ represented by "write" 173 depicted in FIG. 4A to the event sending section 105. The figures by the "write" event indicate the memory address as the head for the data writing, and the data size to be written. For example, such figures as "1000" and "3" represent that the data with the size corresponding to "3" are written from the memory address "1000". The event sending section 105 transmits the request event REQ received from the control timing handling section 106 to the memory model 103.

Upon reception of the "write" request event REQ, the memory model 103 transmits the response event ACK represented by "acknowledge" 174 depicted in FIG. 4A to the event sending section 105. The event sending section 105 transmits the response event received from the memory model 103 to the control timing handling section 106.

Upon reception of the response event ACK of "acknowledge", the control timing handling section 106 transmits the transmission authorization request event CH to the arbitration section 109 again. For example, the control timing handling section 106 transmits the transmission authorization request event represented by "check" 175 depicted in FIG. 4A to the arbitration section 109. In the first embodiment, it is assumed that the conflict does not exist on the bus. In the aforementioned case, the arbitration section 109 transmits the return value of "true" as the notification event RA to the control timing handling section 106.

Upon reception of the return value of "true" from the arbitration section 109, the control timing handling section 106 transmits the response event ACK to the event reception section 104. The event reception section 104 transmits the response event ACK received from the control timing handling section 106 to the CPU model 102.

FIG. 4B illustrates an example of the event in the data timing handling section 107. The event represented by "send" 176 depicted in FIG. 4B indicates the data size information event to be input to the data timing handling section 107. The figures "1000" and "3" denote the memory address as the head for data writing and the size of the data to be written, respectively.

Upon reception of the response event ACK from the event reception section 104, the CPU model 102 transmits the data size information event DataS represented by "send" 176 depicted in FIG. 4B to the event reception section 104. At this time, unlike the actual operation of the hardware 10, the CPU model 102 does not transmit the data information event which contains data to the bus model 101, but the data size information event which does not contain the data to the bus model 101. Upon reception of the data size information event DataS, the event reception section 104 transmits the event DataS to the data timing handling section 107. The data timing handling section 107 transmits the data size information event DataS received from the event reception section 104 to the event sending section 105. The event sending section 105 transmits the data size information event DataS received from the data timing handling section 107 to the memory model 103.

Upon reception of the data size information event DataS, the memory model 103 transmits the event of the process end signal represented by "EOD" 177 depicted in FIG. 4B (EOD event) to the event sending section 105. The event sending section 105 transmits the EOD event received from the memory model 103 to the data timing handling section 107.

The data timing handling section 107 transmits the EOD event received from the event sending section 105 to the event reception section 104, and a notification event RArt for notifying return of the transmission authorization to the arbitration section 109. The event reception section 104 transmits the EOD event received from the data timing handling section 107 to the CPU model 102.

As described above, the data size information event as the event indicating the data size is input/output via the data timing handling section 107, and the event which contains the data is not input/output. The data size information event is input/output to allow the time for processing the control timing model and the data timing model to be reduced compared with the case for inputting/outputting the data information event which contains the data.

FIG. 4C illustrates an example of the event in the function handling section 108. The event represented by "write" 178 depicted in FIG. 4C indicates the process for actually writing the data, that is, the data information event which contains data. Figures "1000" and "3" allocated to the data information event represent that the data with the size corresponding to "3" are written from the memory address "1000", and figures "5", "10" and "2" represent the data to be written, respectively.

The CPU model 102 transmits a data information event DataDW represented by "write" 178 depicted in FIG. 4C to the event reception section 104. The event reception section 104 transmits the data information event DataDW received from the CPU model 102 to the function handling section 108.

The function handling section 108 transmits the data information event DataDW received from the event reception section 104 to the event sending section 105. The event sending section 105 transmits the data information event DataDW received from the function handling section 108 to the memory model 103. The memory model 103 outputs the data "5", "10" and "2" of the data information event DataDW received from the event sending section 105 to the external output of the simulator. Upon the data writing process, it is possible to simulate whether or not the data are accurately passed.

The operation of the simulation model when simulating the process of the CPU 1 for writing data into the memory 13a via the bus 11a has been described. The simulation model according to the first embodiment is capable of obtaining the time information indicating each period for inputting/outputting the control signal and the data signal between the CPU 1 and the memory controller 13b via the bus. The method for obtaining the time information upon simulation of the process for writing data will be described hereinafter.

Figure 5:
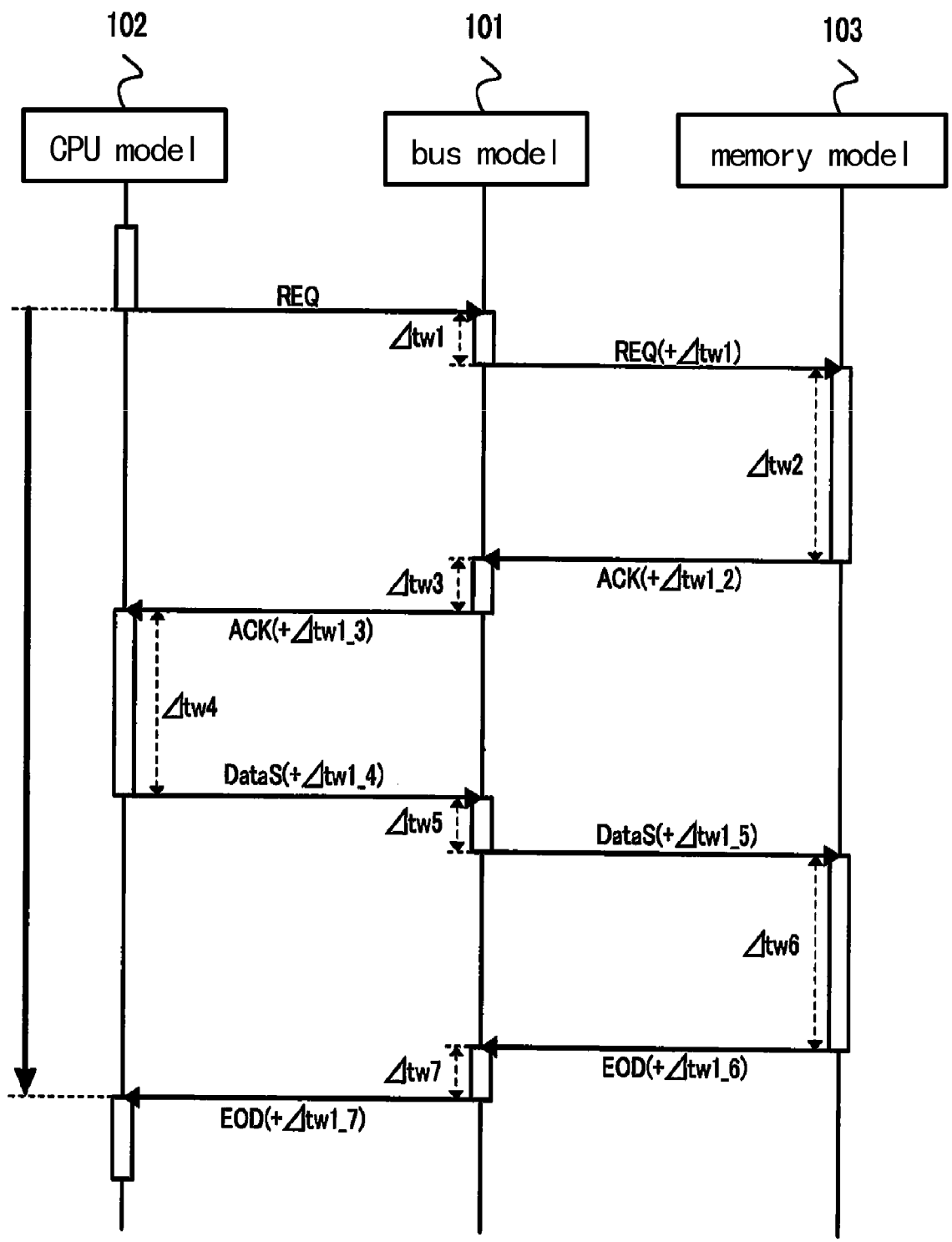
FIG. 5 is a timing chart illustrating an operation of the simulation model upon data writing process.

FIG. 5 is a timing chart depicting the operation of the simulation model in the data writing process. Referring to FIG. 5, each of $\Delta tw1$ to $\Delta tw3$ denotes time information with respect to the control signal, and each of $\Delta tw4$ to $\Delta tw7$ denotes the time information with respect to the data signal. FIG. 6 is a table representing factors based on which each time of the $\Delta tw1$ to $\Delta tw7$ is determined in the data writing process. The process will be described in detail.

The CPU model 102 transmits the writing request event REQ into the memory model 103 to the bus model 101.

Upon reception of the writing request event REQ, the control timing handling section 106 transmits the transmission authorization request event CH to the arbitration section 109 in the bus model 101. Upon reception of the notification event RA indicating permission of the transmission authorization from the arbitration section 109, the control timing handling section 106 transmits the time information $\Delta tw1$ to the memory model 103 together with the writing request event REQ. The time information $\Delta tw1$ corresponds to the stand-by period waiting until the CPU 1 transmits the request signal. For example, the time information $\Delta tw1$ corresponds to the period from the time when the CPU 1 transmits the transmission authorization request to the arbitration circuit 11b until the transmission authorization is obtained from the arbitration circuit 11b to transmit the request signal. Accordingly, the time information $\Delta tw1$ changes depending on presence/absence of the conflict on the bus 11a. In the first embodiment, it is assumed that the conflict on the bus does not exist. So the time information $\Delta tw1$ is set to a fixed value preliminarily set through the experiment. The fixed value is preliminarily stored in the memory of the simulator.

Upon reception of the writing request event REQ and the time information $\Delta tw1$ from the bus model 101, the memory model 103 transmits the response event ACK to the bus model 101. At this time, the memory model 103 transmits the time information $\Delta tw1\_2$ obtained by adding the time information $\Delta tw2$ to the time information $\Delta tw1$ to the bus model 101 together with the response event ACK. The time information $\Delta tw2$ corresponds to the process period in the hardware 10 from the time when the memory controller 13b receives the request signal until completion of preparation for transmitting the response signal. The time information $\Delta tw2$ is set to the fixed value preliminarily set through the experiment.

With the bus model 101, upon reception of the response event ACK and the time information $\Delta tw1\_2$, the control timing handling section 106 transmits the transmission authorization request event CH to the arbitration section 109 again. Upon reception of the notification event RA with respect to permission of the transmission authorization from the arbitration section 109, the control timing handling section 106 transmits the time information $\Delta tw1\_3$ obtained by adding the time information $\Delta tw3$ to the time information $\Delta tw1\_2$ to the CPU model 102 together with the response event ACK. The time information $\Delta tw3$ corresponds to the stand-by period until the memory controller 13b transmits the response signal in the hardware 10. For example, the time information $\Delta tw3$ corresponds to the period from the time when the memory controller 13b sends the transmission authorization request to the arbitration circuit 11b until the response event ACK is transmitted upon reception of the transmission authorization from the arbitration circuit 11b. Accordingly, the time information $\Delta tw3$ changes depending on presence/absence on the conflict on the bus 11a. In the first embodiment, it is assumed that the conflict does not exist on the bus. The time information $\Delta tw3$ is set to the fixed value preliminarily set through the experiment.

The thus obtained time information $\Delta tw1\_3$ becomes the one with respect to the input/output of the control signal upon the data writing process in the hardware 10.

Upon reception of the response event ACK and the time information $\Delta tw1\_3$ from the bus model 101, the CPU model 102 transmits the data size information event DataS to the bus model 101. At this time, the CPU model 102 transmits the time information $\Delta tw1\_4$ obtained by adding the time information $\Delta tw4$ to the time information $\Delta tw1\_3$ to the bus model 101 together with the data size information event DataS. The time information $\Delta tw4$ corresponds to the process period in the hardware 10 from the time when the CPU 1 receives the response signal until transmission of the data signal which contains the data. For example, the time information $\Delta tw4$ corresponds to the time obtained by summing the time taken for the CPU 1 to prepare the data signal which contains data and the time taken for the CPU 1 to output the data signal to the bus 11a. The time information $\Delta tw4$ may be obtained by multiplying the process period per data by data size information. The process period per data is set to the fixed value preliminarily set through the experiment.

In the bus model 101, the data timing handling section 107 transmits the time information $\Delta tw1\_5$ obtained by adding the time information $\Delta tw5$ to the time information $\Delta tw1\_4$ to the memory model 103 together with the data size information event DataS received from the CPU model 102. At this time, the time information $\Delta tw5$ corresponds to the transmission period for transmitting the data signal via the bus 11a in the hardware 10. The time information $\Delta tw5$ is obtained by multiplying the transmission period per data by the data size information. The transmission period per data is set to the fixed value preliminarily set through the experiment.

Upon reception of the data size information event DataS and the time information $\Delta tw1\_5$ from the bus model 101, the memory model 103 transmits the EOD event to the bus model 101. At this time, the memory model 103 transmits the time information $\Delta tw1\_6$ obtained by adding the time information $\Delta tw6$ to the time information $\Delta tw1\_5$ to the bus model 101 together with the EOD event. The time information $\Delta tw6$ corresponds to the process period for the data to be written into the memory 13a in the hardware 10. For example, the time information $\Delta tw6$ is obtained by multiplying the time for writing into the memory per data by the data size information. The writing time into the memory per data is set to the fixed value preliminarily set through the experiment.

In the bus model 101, the data timing handling section 107 transmits the time information $\Delta tw1\_7$ obtained by adding the time information $\Delta tw7$ to the time information $\Delta tw1\_6$ to the CPU model 102 via the event reception section 104 together with the EOD event received from the memory model 103. The time information $\Delta tw7$ corresponds to the transmission period for transmitting the process end signal via the bus 11a in the hardware 10. The time information $\Delta tw7$ is set to the fixed value preliminarily set through the experiment.

The thus obtained time information $\Delta tw1\_7$ corresponds to the total time taken for writing data in the hardware 10 (time from output of the data writing request by the CPU 1 until the process end signal is obtained). Upon reception of the EOD event, the CPU model 102 obtains the total time for writing data into the memory as the time information $\Delta tw1\_7$. The time information with respect to the total sum of the time information from $\Delta tw4$ to $\Delta tw7$ corresponds to the period for inputting/outputting the data signal upon the data writing process.

The time information may be passed sequentially as the process executed in the respective sections from the CPU model to the bus model, from the bus model to the memory model, from the memory model to the bus model, from the bus model to the CPU model, and the like (transaction), which will be separately subjected to the transaction modeling. This makes it possible to pass the time information between the transaction models.

As described above, the simulation model according to the first embodiment includes the control timing model formed by modeling the timing for inputting/outputting the control signal and the data timing model formed by modeling the timing for inputting/outputting the data signal, for example. The control timing model calculates the time for inputting/outputting the control signal through the CPU model 102, the control timing handling section 106 of the bus model 101, and the memory model 103. For example, the control timing handling section 106 calculates the time information $\Delta tw1$ and $\Delta tw3$, and the memory model 103 calculates the time information $\Delta tw2$. In the data writing process, the period for transferring the control signal between the CPU 1 and the memory controller 13b in the hardware 10 corresponds to the time information $\Delta tw1$ and $\Delta tw3$, for example. The period for processing the control signal corresponds to the time information $\Delta tw2$, for example. The control signal transfer period calculation section corresponds to the control timing handling section 106, and the control signal processing time calculation section corresponds to the memory model 103. The data timing model calculates the time for inputting/outputting the data signal through the CPU model 102, the data timing handling section 107 of the bus model 101 and the memory model 103. For example, the data timing handling section 107 calculates the time information $\Delta tw5$ and $\Delta tw7$. The CPU model 102 and the memory model 103 calculate the time information $\Delta tw4$ and $\Delta tw6$, respectively. In the data writing process, the period for transferring the data signal between the CPU1 and the memory controller 13b in the hardware 10 corresponds to the time information $\Delta tw5$ and $\Delta tw7$. The period for processing the data signal corresponds to the time information $\Delta tw4$ and $\Delta tw6$, for example. So the data signal transfer period calculation section corresponds to the data timing handling section 107, and the data signal processing time calculation section corresponds to the CPU model 102 and the memory model 103, for example.

The generally employed simulation model allows the memory model to calculate the data writing period when the request event indicating the data writing request is transmitted to the memory model from the CPU model via the bus model. For example, upon reception of the event represented by "write" 173 depicted in FIG. 4A, the memory model calculates the data writing period. The memory model transmits the response event and the EOD event to the CPU model via the bus. That is, the generally employed simulation model does not calculate the time information in consideration of each timing for inputting/outputting the data signal and the control signal.

Upon simulation of the data writing process, the simulation model according to the first embodiment calculates the time information in consideration of each timing for inputting/outputting the data signal and the control signal. For example, likewise the respective input/output operations of the control signal and the data signal executed in the hardware, the simulation model according to the first embodiment inputs/outputs the events indicating the control signal and the data signal, respectively. The simulation model according to the first embodiment calculates the time information with respect to the control signal and the one with respect to the data signal during input/output operations of the respective events. Compared with the generally employed simulation model, the simulation model according to the first embodiment is more approximate to the hardware to be simulated. This makes it possible to calculate the total time for the data writing process while improving the accuracy.

The simulation model according to the first embodiment inputs/outputs the data size information events corresponding to the input/output of the event indicating the data signal. Based on the data size information event, the simulation model calculates the time information $\Delta tw5$ with respect to the data transmission period, and $\Delta tw4$ and $\Delta tw6$ with respect to the data signal processing period. As a result, the time for simulation may be reduced compared with the case for inputting/outputting the data information event.

(Process for Reading Data from Memory)

The operation of the simulation model for simulating the data reading of the CPU 1 from the memory 13a via the bus 11a will be described referring to FIGS. 7 and 8.

Figure 7:
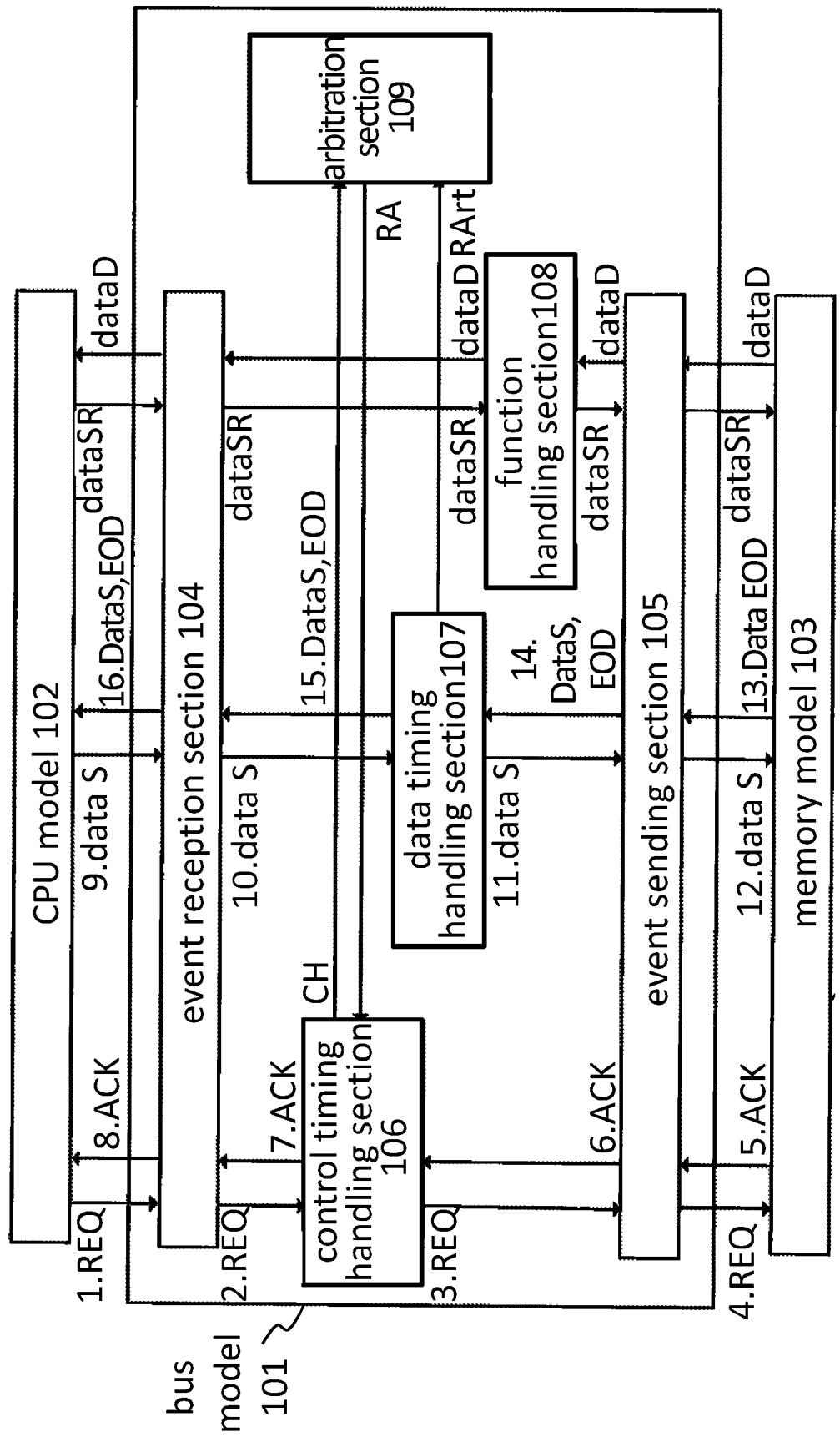
FIG. 7 is a block diagram illustrating a structure example of the simulation model according to the first embodiment.

Likewise the diagram depicted in FIG. 3, FIG. 7 is a block diagram depicting an example of the structure of the simulation model according to the first embodiment. Unlike the diagram depicted in FIG. 3, the solid-line arrow in FIG. 7 indicates the flow of the event when simulating the data reading. The alphabetical letters at the base point of the solid-line arrow denote the code of the event when simulating the data reading process. The figure by the side of the alphabetical letters denotes the order for inputting/outputting the event via the control timing handling section 106 and the data timing handling section 107.

FIGS. 8A to 8C depict examples of events in the control timing handling section 106, the data timing handling section 107 and the function handling section 108, respectively upon modeling the data reading process.

FIG. 8A illustrates the example of the event in the control timing handling section 106. Referring to FIG. 8A, statements at the left and right ends indicate the event and the return value with respect to the event.

Referring to FIG. 7, the CPU model 102 transmits a request event REQ indicating the data reading request to the bus model 101. For example, the CPU model 102 transmits the event represented by "request" 181 and "read" 183 depicted in FIG. 8A to the event reception section 104. In the bus model 101, the event reception section 104 transmits the request event REQ received from the CPU model 102 to the control timing handling section 106.

Upon reception of the request event REQ represented by "request" 181 depicted in FIG. 8A, the control timing handling section 106 transmits the transmission authorization request event CH to the arbitration section 109. For example, the control timing handling section 106 transmits the event represented by "check" 182 depicted in FIG. 8A to the arbitration section 109.

Upon reception of the transmission authorization request event CH from the control timing handling section 106, the arbitration section 109 determines whether or not the transmission authorization is given to the control timing handling section 106. In the first embodiment, as it is assumed that the conflict does not exist on the bus, the arbitration section 109 transmits the return value of "true" to the control timing handling section 106 as the notification event RA.

Upon reception of the return value of "true" from the arbitration section 109, the control timing handling section 106 transmits the request event REQ represented by "read" 183 depicted in FIG. 8A to the event sending section 105. Figures allocated to the "read" event represent the memory address as the head for the data reading and the data size to be read. For example, the figures "1000" and "3" represent that the data with the size corresponding to "3" are read from the memory address "1000". The event sending section 105 transmits the request event REQ received from the control timing handling section 106 to the memory model 103.

Upon reception of the request event REQ from the event sending section 105, the memory model 103 transmits the response event ACK represented by "acknowledge" 184 depicted in FIG. 8A to the event sending section 105. The event sending section 105 transmits the response event ACK received from the memory model 103 to the control timing handling section 106.

Upon reception of the response event ACK of "acknowledge", the control timing handling section 106 transmits the transmission authorization request event CH to the arbitration section 109 again. For example, the control timing handling section 106 transmits the event represented by "check" 185 depicted in FIG. 8A to the arbitration section 109. In the first embodiment, as it is assumed that the conflict does not exist on the bus, the arbitration section 109 transmits the return value of "true" to the control timing handling section 106 as the notification event RA.

Upon reception of the return value of "true" from the arbitration section 109, the control timing handling section 106 transmits the response event ACK to the event reception section 104. The event reception section 104 transmits the response event ACK received from the control timing handling section 106 to the CPU model 102.

FIG. 8B depicts an example of the event in the data timing handling section 107. Each event represented by "send" 186, 187 depicted in FIG. 8B denotes the data size information event to be input to the data timing handling section 107. The figures "1000" and "3" allocated to 186 and 187 denote the memory address as the head for the data reading and the data size to be read, respectively.

Upon reception of the response event ACK from the event reception section 104, the CPU model 102 transmits the data size information event DataS represented by "send" 186 depicted in FIG. 8B to the event reception section 104. Upon reception of the data size information event DataS, the event reception section 104 transmits the data size information event DataS to the data timing handling section 107. The data timing handling section 107 transmits the data size information event DataS received from the event reception section 104 to the event sending section 105. The event sending section 105 transmits the data size information event DataS received from the data timing handling section 107 to the memory model 103.

Upon reception of the data size information event DataS, the memory model 103 returns the received data size information event DataS to the event sending section 105, and transmits the EOD event to the event sending section 105 as well. At this time, unlike the actual operation in the hardware 10, the memory model 103 returns the data size information event to the bus model 101 rather than transmitting the data information event which contains data to the bus model 101. The event sending section 105 transmits the data size information event DataS received from the memory model 103 and the EOD event to the data timing handling section 107. The event represented by "send" 187 and event represented by "EOD" 188 depicted in FIG. 8B denote the data size information event DataS and the EOD event received by the data timing handling section 107 from the event sending section 105, respectively.

The data timing handling section 107 transmits the data size information event DataS and EOD event received from the event sending section 105 to the event reception section 104, and further transmits the notification event RArt with respect to return of the transmission authorization to the arbitration section 109. The event reception section 104 transmits the data size information event DataS and the EOD event received from the data timing handling section 107 to the CPU model 102.

Likewise the data writing process as described above, in the data reading process, the data size information event indicating the data size is input/output via the control timing handling section 106 and the data timing handling section 107, and the event which contains data is not input/output.

FIG. 8C illustrates an example of the event in the function handling section 108. The event represented by "read" 190 depicted in FIG. 8C indicates the process for actually reading the data as the data size information event. The figures "1000" and "3" allocated to the data information event indicate that data with the size corresponding to "3" are read from the memory address "1000".

The CPU model 102 transmits the data size information event DataSR represented by "read" 190 depicted in FIG. 8C to the event reception section 104. Upon reception of the data size information event of "read", the event reception section 104 transmits the data size information event DataSR to the function handling section 108.

Upon reception of the data size information event DataSR, the function handling section 108 transmits the event to the event sending section 105. The event sending section 105 transmits the data size information event DataSR received from the function handling section 108 to the memory model 103. Based on the memory address and the data size corresponding to the data size information event DataSR received from the event sending section 105, the memory model 103 reads the data from the memory of the simulator. The memory model 103 transmits the read data to the event sending section 105 as the data information event DataDR. The event sending section 105 transmits the data information event DataDR received from the memory model 103 to the function handling section 108. The event represented by "data" 191 depicted in FIG. 8C denotes the data information event DataDR, and figures "5", "10" and "2" denote data read from the memory of the simulator, respectively.

The function handling section 108 transmits the data information event DataDR received from the event sending section 105 to the event reception section 104. The event reception section 104 transmits the data information event DataDR received from the function handling section 108 to the CPU model 102. The CPU model 102 outputs the data "5", "10" and "2" of the data information event DataDR received from the event reception section 104 to the external output unit of the simulator. This makes it possible to simulate whether or not the data are accurately passed in the data reading process.

The operation of the simulation model when simulating the process of the CPU 1 for reading data from the memory 13a via the bus 11a has been described. As described above, input/output of the control event upon simulation of the data reading process may be performed in the same way as in the case where the control event is passed upon simulation of the data writing process. Likewise the case for simulating the data writing process, the data size information event indicating the data size is input/output via the data timing handling section 107. When simulating the data reading process, it is possible to obtain the time information indicating each time for inputting/outputting the control signal and the data signal between the CPU 1 and the memory controller 13b via the bus. The method for obtaining the time information upon simulation of the data reading process will be described.

Figure 9:
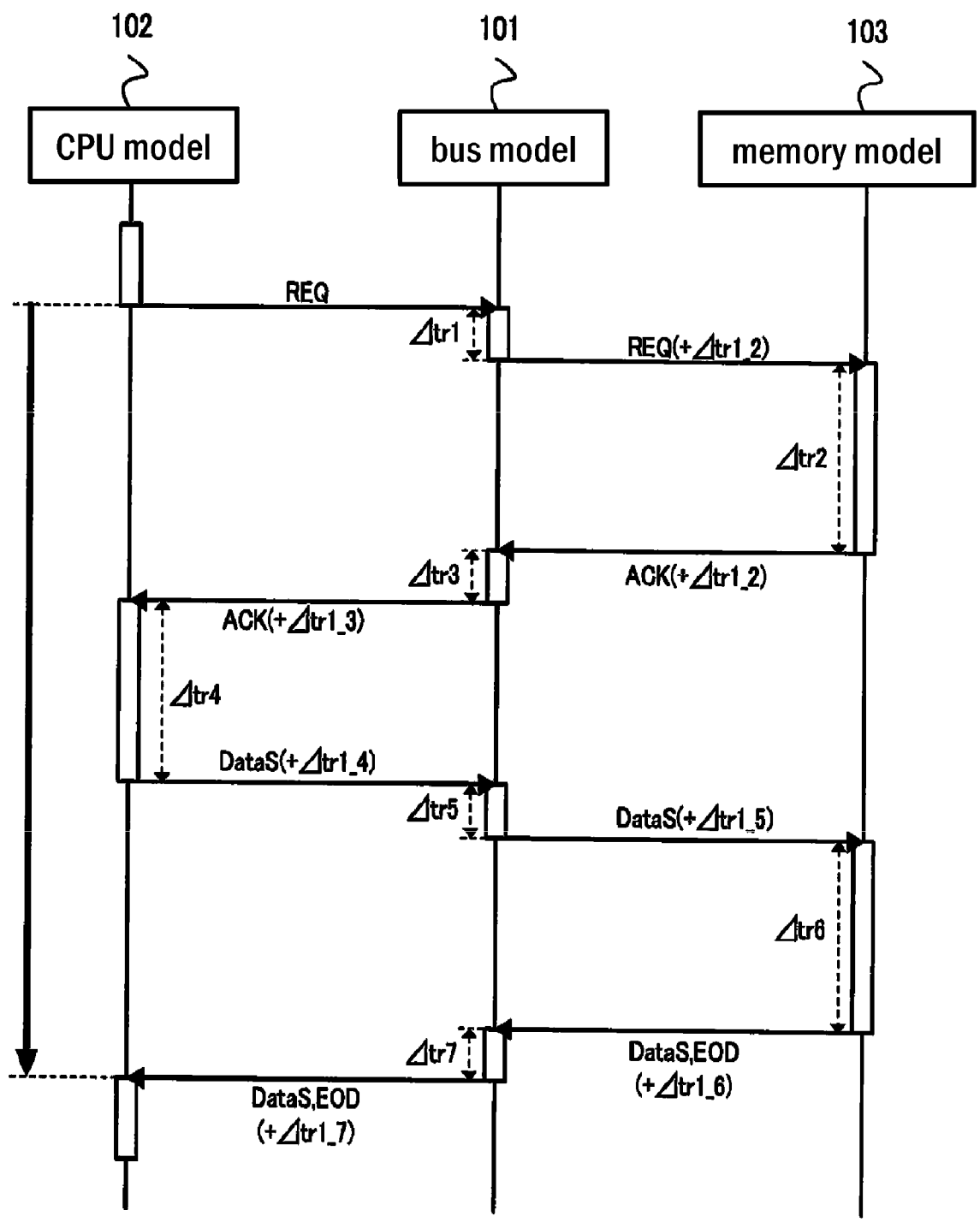
FIG. 9 is a timing chart illustrating an operation of the simulation model upon simulation of the data reading process.

FIG. 9 is a timing chart illustrating the operation of the simulation model for simulating the data reading process. Referring to FIG. 9, Δtr1 to Δtr3 denote the time information with respect to the control signal, and Δtr4 to Δtr7 denote the time information with respect to the data signal. FIG. 10 is a table depicting factors based on which each time of the Δtr1 to Δtr7 is determined in the data reading process. The specific explanation will be described hereinafter.

The CPU model 102 transmits the reading request event REQ with respect to the memory model 103 to the bus model 101.

In the bus model 101, upon reception of the reading request event REQ, the control timing handling section 106 transmits the transmission authorization request event CH to the arbitration section 109. Upon reception of the notification event RA with respect to permission of the transmission authorization from the arbitration section 109, the control timing handling section 106 transmits the reading request event REQ and the time information Δtr1 to the memory model 103. Likewise the data writing process, the time information Δtr1 corresponds to the stand-by period waiting until the CPU 1 transmits the request signal in the hardware 10. For example, the time information Δtr1 corresponds to the period from the time when the CPU 1 sends the transmission authorization request to the arbitration circuit 11b until the transmission authorization is obtained from the arbitration circuit 11b to transmit the request event REQ. Accordingly, the time information Δtr1 changes depending on presence/absence of the conflict on the bus 11a. In the first embodiment, as it is assumed that the conflict does not exist on the bus, the time information Δtr1 is set to the fixed value preliminarily set through the experiment.

Upon reception of the reading request event REQ and the time information Δtr1 from the bus model 101, the memory model 103 transmits the response event ACK to the bus model 101. The memory model 103 transmits the time information Δtr1_2 obtained by adding the time information Δtr2 to the time information Δtr1 to the bus model 101 together with the response event ACK. The time information Δtr2 corresponds to the process period from the time when the memory controller 13b receives the reading request signal until the preparation for transmitting the response signal is finished in the hardware 10 likewise the data writing process. The time information Δtr2 is set to the fixed value preliminarily set through the experiment.

In the bus model 101, upon reception of the response event ACK and the time information Δtr1_2, the control timing handling section 106 transmits the transmission authorization request event to the arbitration section 109 again. Upon reception of the notification event RA with respect to permission of the transmission authorization from the arbitration section 109, the control timing handling section 106 transmits the time information Δtr1_3 obtained by adding the time information Δtr3 to the time information Δtr1_2 to the CPU model 102 together with the response event ACK. The time information Δtr3 corresponds to the stand-by period waiting until the memory controller 13b transmits the response signal in the hardware 10 likewise the data writing process. For example, the time information Δtr3 corresponds to the period from the time when the memory controller 13b sends the transmission authorization request to the arbitration circuit 11b until the transmission authorization is obtained from the arbitration circuit 11b to transmit the response event ACK. So the time information Δtr3 changes depending on presence/absence of conflict on the bus 11a. In the first embodiment, as it is assumed that the conflict does not exist on the bus, the time information Δtr3 is set to the fixed value preliminarily set through the experiment.

The thus obtained time information Δtr1_3 is the one with respect to input/output of the control signal in the data reading process in the hardware 10. As described above, the time information Δtr1 to Δtr3 upon simulation of the data reading process may be obtained by the same method for obtaining the time information Δtw1 to Δtw3 upon simulation of the data writing process as described above.

Upon reception of the response event ACK and the time information Δtr1_3 from the bus model 101, the CPU model 102 transmits the data size information event DataS to the bus model 101. The CPU model 102 transmits the time information Δtr1_4 obtained by adding the time information Δtr4 to the time information Δtr1_3 to the bus model 101 together with the data size information event DataS. The time information Δtr4 corresponds to the process period from the time when the CPU 1 receives the response signal until preparation for transmitting the data signal which contains the data address and the data size is finished. The data signal does not contain data, and accordingly, the time information Δtr4 is set to the fixed value preliminarily set through the experiment.

In the bus model 101, the data timing handling section 107 transmits the data size information event DataS received from the CPU model 102 and the time information Δtr1_5 obtained by adding the time information Δtr5 to the time information Δtr1_4 to the memory model 103. The time information Δtr5 corresponds to the transmission period for transmitting the data signal which contains the data address and the data size via the bus 11a in the hardware 10. As the data signal does not contain data, the time information Δtr5 is set to the fixed value preliminarily set through the experiment.

Upon reception of the data size information event DataS and the time information Δtr1_5 from the bus model 101, the memory model 103 transmits the data information event DataS and the EOD event to the bus model 101. At this time, the memory model 103 transmits the time information Δtr1_6 obtained by adding the time information Δtr6 to the time information Δtr1_5 to the bus model 101 together with the data information event DataS and the EOD event. The time information Δtr6 corresponds to the processing period for reading data from the memory 13a in the hardware 10. For example, the time information Δtr6 is obtained by multiplying the reading time from the memory per data by the data size information. The reading time from the memory per data is set to the fixed value preliminarily set through the experiment.

In the bus model 101, the data timing handling section 107 transmits the time information Δtr1_7 obtained by adding the time information Δtr7 to the time information Δtr1_6 to the CPU model 102 together with the data size information event DataS and the EOD event.

The time information Δtr7 corresponds to the transmission period for transmitting the data signal which contains data via the bus 11a in the hardware 10. For example, the time information Δtr7 is obtained by multiplying the transmission period per data by the data size information. The transmission period per data is set to the fixed value preliminarily set through the experiment.

The thus obtained time information Δtr1_7 corresponds to the total time for the data reading process in the hardware 10 (period from the time when the CPU 1 outputs the data reading request until the process end signal is obtained). That is, upon reception of the EOD event, the CPU model 102 obtains the time information Δtr1_7 as the total time for the data reading process. The sum total of the time information Δtr4 to Δtr7 corresponds to the time for inputting/outputting the data signal in the data reading process.

As described above, in the data reading process, the control timing model calculates the time for inputting/outputting the control signal through the CPU 102, and the control timing handling section 106 of the bus model 101 and the memory model 103. For example, the control timing handling section 106 calculates the time information Δtr1 and Δtr3, and the memory model 103 calculates the time information Δtr2. In the data reading process, the transfer period of the control signal between the CPU 1 and the memory controller 13b in the hardware 10 corresponds to the time information Δtr1, Δtr3, for example. The period for processing the control signal corresponds to the time information Δtr2. The data timing model calculates the time for inputting/outputting the data signal through the CPU model 102, the data timing handling section 107 of the bus model 101, and the memory model 103. For example, the data timing handling section 107 calculates the time information Δtr5 and Δtr7. The CPU model 102 and the memory model 103 calculate the time information Δtr4 and Δtr6, respectively. In the data reading process, the period for transferring the data signal between the CPU 1 and the memory controller 13b in the hardware 10 corresponds to the time information Δtr5, Δtr7, and the period for processing the data signal corresponds to the time information Δtr4, Δtr6, for example.

The simulation model according to the first embodiment calculates the time information in consideration of the timing for inputting/outputting the data signal and the control signal upon simulation of the data reading process. The simulation model according to the first embodiment is more approximated to the hardware to be simulated, and allows calculation of the total time for the data reading process with high accuracy.

Second Embodiment

A simulation model according to a second embodiment will be described referring to FIGS. 11 to 13. The operation of the simulation model for the simulation according to the second embodiment will be described on the assumption that the conflict occurs on the bus.

FIG. 11 is a block diagram illustrating an example of a hardware structure to be simulated as the simulation model according to the second embodiment.

Referring to FIG. 11, the same components as those depicted in FIG. 1 will be designated with the same reference numerals. A hardware 20 to be simulation modeled according to the second embodiment is different from the hardware 10 depicted in FIG. 1 in that two CPUs 1 and 2 are connected to the bus 11a. That is, the hardware to be simulation modeled according to the second embodiment is multi-processor hardware. The hardware 20 is structured to have two units of the CPUs 1 and 2 for inputting/outputting the control signal and the data signal from/to the memory controller 13b via the bus 11a, respectively.

For example, the CPUs 1 and 2 transmit signals each indicating the transmission authorization request to the arbitration circuit 11b upon input/output of the control signals from/ to the memory controller 13b. The arbitration circuit 11b permits the transmission authorization to any one of the CPUs 1 and 2. Among the CPUs 1 and 2, the one which receives the signal indicating permission of the transmission authorization from the arbitration circuit 11b is allowed to input/output the control signal and the data signal from/to the memory controller 13b via the bus 11a. The other CPU which does not receive the signal indicating permission of the transmission authorization waits for transmission/reception of the control signal and the data signal until the CPU which receives the signal indicating permission of the transmission authorization finishes the process.

Figure 12:
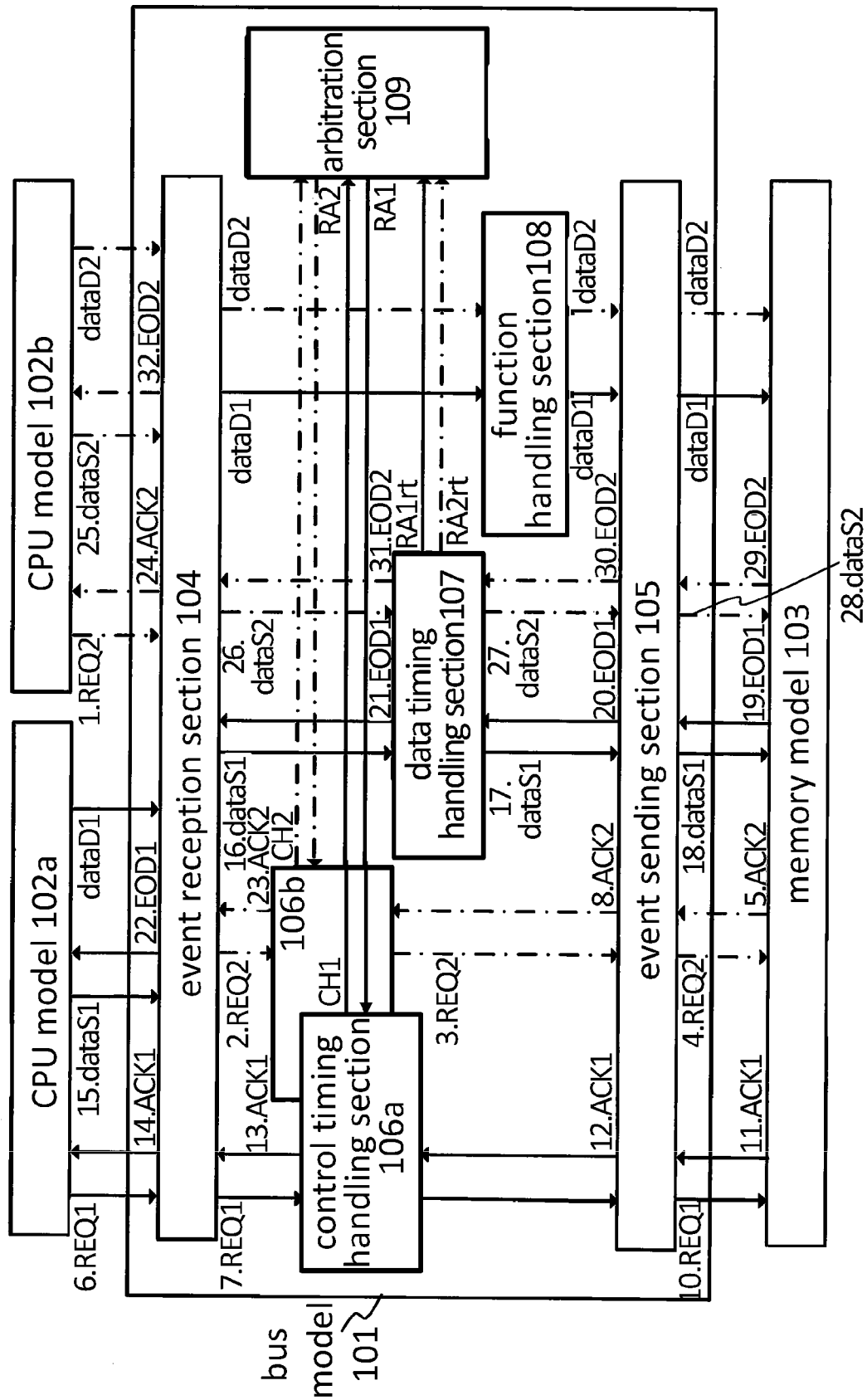
FIG. 12 is a block diagram depicting a structure example of the simulation model according to the second embodiment.

FIG. 12 is a block diagram illustrating an example of a structure of the simulation model according to the second embodiment. Referring to FIG. 12, the same components as those depicted in FIG. 3 will be designated with the same reference numerals.

The simulation model according to the second embodiment corresponds to the hardware 20 depicted in FIG. 11. Likewise the simulation model according to the first embodiment, it may be provided as the program which runs on the simulator such as the computer. The program of the simulation model runs on the simulator to realize the performance evaluation device.

The simulation model according to the second embodiment includes the bus model 101, a CPU1 model 102a, a CPU2 model 102b, and the memory model 103. The CPU1 model 102a is formed by modeling the CPU 1, and the CPU2 model 102b is formed by modeling the CPU 2.

In the simulation model according to the second embodiment, both of the two CPU models 102a and 102b, and the memory model 103 input/output the control event and the data event via the bus model 101. Referring to FIG. 12, the solid-line arrow represents the flow of the event input/output among the CPU1 model 102a, the bus model 101 and the memory model 103. A chain-line arrow represents the flow of the event input/output among the CPU2 model 102b, the bus model 101 and the memory model 103.

The bus model 101 includes the event reception section 104, the event sending section 105, control timing handling sections 106a, 106b, the data timing handling section 107, the function handling section 108, and the arbitration section 109.

The control timing handling section 106a is model operation means for the bus model 101 formed by modeling the timing for inputting/outputting the control signal between the CPU 1 and the memory controller 13b via the bus 11a. For example, the control timing handling section 106a passes the control event between the CPU1 model 102a and the memory model 103.

The control timing handling section 106b is model operation means for the bus model 101 formed by modeling the timing for inputting/outputting the control signal between the CPU 2 and the memory controller 13b via the bus 11a. For example, the control timing handling section 106b passes the control event between the CPU2 model 120b and the memory model 103.

The flow of the operation of the simulation model according to the second embodiment will be described with respect to each operation of the CPUs 1 and 2 upon simulation of the data writing into the memory 13a via the bus 11a, respectively referring to FIGS. 12 and 13.

Referring to FIG. 12, the alphabetical letters at each base point of the solid-line arrow and the chain-line arrow denote the code of the event upon simulation of the data writing process. The figure by the side of the alphabetical letters denotes the order for inputting/outputting the event.

FIGS. 13A to 13D illustrate examples of events in the control timing handling sections 106a and 106b, the data timing handling section 107, and the function handling section 108.

FIG. 13A illustrates an example of the event in the control timing handling section 106a. FIG. 13B illustrates an example of the event in the control timing handling section 106b. Referring to FIGS. 13A and 13B, the statements at the left and right ends indicate the events and the return values to the events, respectively.

Referring to FIG. 12, it is assumed that the CPU2 model 102b transmits a request event REQ2 indicating the data writing request to the bus model 101. At this time, the CPU2 model 102b adds the information (priority information) indi-cating the priority of the request event to the request event REQ2 so as to be transmitted to the bus model 101. The event reception section 104 transmits the request event REQ2 received from the CPU2 model 102b to the control timing handling section 106b. The request event REQ2 corresponds to the event represented by "request" 371 and "write" 373 depicted in FIG. 13B. The priority information corresponds to the figure "2" of the event represented by "request" 371 depicted in FIG. 13B. The priority will become high as the figure becomes small.

Upon reception of the request event REQ2 of "request" from the event reception section 104, the control timing handling section 106b transmits a transmission authorization request event CH2 represented by "check" 372 depicted in FIG. 13B and the priority information "2" to the arbitration section 109. In this stage, the arbitration section 109 has not received the transmission authorization request from the other control timing handling section 106a. That is, it may be assumed that the conflict does not occur on the bus 11a. So the arbitration section 109 returns the return value of "true" indicating permission of the transmission authorization to the control timing handling section 106b as a notification event RA2.

Upon reception of the return value of "true" indicating permission of the transmission authorization from the arbitration section 109, the control timing handling section 106b transmits a request event REQ2 represented by "write" 373 depicted in FIG. 13B to the event sending section 105. The event sending section 105 transmits the request event REQ2 represented by "write" received from the control timing handling section 106b to the memory model 103.

Upon reception of the request event REQ2 of "write", the memory model 103 transmits a response event ACK2 represented by "acknowledge" 374 depicted in FIG. 13B to the control timing handling section 106 via the event sending section 105.

It is assumed that the CPU1 model 102a transmits a request event REQ1 indicating the data writing request to the bus model 101 for the period from the time when the control timing handling section 106b transmits the request event REQ2 until reception of the response event ACK2. The CPU1 model 102a adds the information (priority information) indicating priority of the request event REQ1 to the request event REQ1 so as to be transmitted to the bus model 101. The event reception section 104 transmits the request event REQ1 received from the CPU1 model 102a to the control timing handling section 106a. The request event REQ1 indicating the data writing request corresponds to the event represented by "request" 271 and "write" 274 depicted in FIG. 13A. The priority information corresponds to the figure "1" of the event represented by "request" 271 depicted in FIG. 13A. In the aforementioned case, the control event transmitted from the CPU1 model 102a has the priority higher than that of the control event transmitted from the CPU2 model 102b.

Upon reception of the request event REQ1 represented by "request" from the event reception section 104, the control timing handling section 106a transmits a transmission authorization request event CH1 represented by "check" 272 and the priority information "1" depicted in FIG. 13A to the arbitration section 109. At this time, the arbitration section 109 has already sent permission of the transmission authorization to the other control timing handling section 106b. So the arbitration section 109 does not send permission of the transmission authorization to the control timing handling section 106a, and transmits the return value of "false" as a notification event RA1. The arbitration section 109 does not send permission of the transmission authorization to the control timing handling section 106a until the response event ACK2 is returned to the control timing handling section 106b.

Meanwhile, upon reception of the response event ACK2 from the event sending section 105, the control timing handling section 106b transmits the transmission authorization request event CH2 represented by "check" 375 depicted in FIG. 13B to the arbitration section 109. At this time, the arbitration section 109 has already received the transmission authorization request event CH1 from the control timing handling section 106a as described above. The arbitration section 109 sends permission of the transmission authorization to any one of the two control timing handling sections 106a and 106b, which passes the event with the higher priority. That is, the arbitration section 109 transmits the return value of "true" as the notification event RA1 to the control timing handling section 106a which has passed the control event with the priority information "1" as the statement 273 in FIG. 13A depicts. The arbitration section 109 transmits the return value of "false" as the notification event RA2 to the control timing handling section 106b which has passed the event with the lower priority as the statement 375 in FIG. 13B depicts. The arbitration section 109 does not send permission of the transmission authorization to the control timing handling section 106b with the lower priority as the statement 376 in FIG. 13B depicts until the end of input/output of the control event and the data event between the CPU1 model 102a and the memory model 103.

Upon reception of the return value of "true" from the arbitration section 109, the control timing handling section 106a transmits the request event REQ1 represented by "write" 274 depicted in FIG. 13A to the event sending section 105. The event sending section 105 transmits the request event REQ1 "write" received from the control timing handling section 106a to the memory model 103.

Upon reception of the request event REQ1 of "write", the memory model 103 transmits the response event ACK1 represented by "acknowledge" 275 depicted in FIG. 13A to the control timing handling section 106a via the event sending section 105.

Upon reception of the response event ACK1 of "acknowledge" from the event sending section 105, the control timing handling section 106a transmits the transmission authorization request event CH1 represented by "check" 276 depicted in FIG. 13A to the arbitration section 109. The arbitration section 109 has already received the transmission authorization request event CH2 from the control timing handling section 106b as described above. The arbitration section 109 then transmits the return value of "true" indicating permission of the transmission to the control timing handling section 106a which has passed the event with the higher priority as the notification event RA1.

Upon reception of the return value of "true" from the arbitration section 109, the control timing handling section 106a transmits the response event ACK1 of "acknowledge" to the event reception section 104. The event reception section 104 transmits the response event ACK1 received from the control timing handling section 106a to the CPU1 model 102a.

FIG. 13C illustrates an example of the event in the data timing handling section 107. The event represented by "send" 281 depicted in FIG. 13C corresponds to the data size information event input from the CPU1 model 102a to the data timing handling section 107. The event represented by "send" 381 depicted in FIG. 13C corresponds to the data size information event to be input from the CPU2 model 102b to the data timing handling section 107. Figures "1000" and "3" allocated to the statements 281 and 381 depicted in FIG. 13C denote the memory address as the head for the data writing and the data size.

Upon reception of the response event ACK1 from the event reception section 104, the CPU1 model 102a transmits a data size information event DataS1 represented by "send" 281 depicted in FIG. 13C to the event reception section 104. Upon reception of the data size information event DataS1, the event reception section 104 transmits the data size information event DataS1 to the data timing handling section 107. The data timing handling section 107 transmits the data size information event DataS1 received from the event reception section 104 to the event sending section 105. The event sending section 105 transmits the data size information event DataS1 received from the data timing handling section 107 to the memory model 103.

Upon reception of the data size information event dataS1 from the event sending section 105, the memory model 103 transmits the EOD event (EOD1 event) represented by "EOD1" 282 depicted in FIG. 13C to the data timing handling section 107 via the event sending section 105. The data timing handling section 107 transmits the EOD1 event received from the event sending section 105 to the event reception section 104, and transmits the notification event RA1rt indicating return of the transmission authorization to the arbitration section 109. The event reception section 104 transmits the EOD1 event received from the data timing handling section 107 to the CPU1 model 102a.

Upon reception of the notification event RA1rt with respect to return of the transmission authorization from the data timing handling section 107, the arbitration section 109 determines that all the input/output operations of the events between the CPU1 model 102a and the memory model 103 have been finished. The arbitration section 109 then transmits the return value of "true" to the control timing handling section 106b which has been kept stand-by for the event transmission as the notification event RA2 represented by the statement 377 depicted in FIG. 13B. Upon reception of the return value of "true" from the arbitration section 109, the control timing handling section 106b transmits the response event ACK2 of "acknowledge" to the event reception section 104. The event reception section 104 transmits the response event ACK2 of "acknowledge" received from the control timing handling section 106b to the CPU2 model 102b.

Upon reception of the response event ACK2 of "acknowledge" from the event reception section 104, the CPU2 model 102b transmits a data size information event DataS2 represented by "send" 381 depicted in FIG. 13C to the event reception section 104. Upon reception of the data size information event DataS2, the event reception section 104 transmits the data size information event dataS2 to the data timing handling section 107. The data timing handling section 107 transmits the data size information event DataS2 received from the event reception section 104 to the event sending section 105. The event sending section 105 transmits the data size information event DataS2 received from the data timing handling section 107 to the memory model 103.

Upon reception of the data size information event DataS2, the memory model 103 transmits the EOD event (EOD2 event) represented by "EOD2" 382 depicted in FIG. 13C to the data timing handling section 107 via the event sending section 105. The data timing handling section 107 transmits the EOD2 event received from the event sending section 105 to the event reception section 104, and transmits the notification event RA2rt with respect to return of the transmission authorization to the arbitration section 109. The event reception section 104 transmits the EOD event received from the data timing handling section 107 to the CPU2 model 102b.

FIG. 13D illustrates an example of the event in the function handling section 108. The event represented by "write" 291 depicted in FIG. 13D corresponds to the data information event transmitted from the CPU1 model 102a to the memory model 103. The event represented by "write" 391 depicted in FIG. 13D corresponds to the data information event transmitted from the CPU2 model 102b to the memory model 103. Figures "1000" and "3" allocated to the data information event designated as 291 and 391 of FIG. 13D represent that data with the size corresponding to "3" are written from the memory address "1000". Figures "5", "10" and "2" represent data to be written.

The CPU1 model 102a transmits a data information event DataD1 represented by "write" 291 depicted in FIG. 13D to the function handling section 108 via the event reception section 104. Upon reception of the data information event DataD1, the function handling section 108 transmits the data information event DataD1 to the memory model 103 via the event sending section 105. The memory model 103 outputs data "5", "10" and "2" of the data information event DataD1 of "write" received from the event sending section 105 to the external output of the simulator. In the data writing process, it is possible to simulate whether the data from the CPU1/CPU2 to the memory is accurately passed.

The CPU2 model 102b transmits a data information event DataD2 represented by "write" 391 depicted in FIG. 13D to the function handling section 108 via the event reception section 104. Upon reception of the data information event DataD2 of "write", the function handling section 108 transmits the data information event DataD2 to the memory model 103 via the event sending section 105. The memory model 103 outputs data "5", "10" and "2" of the data information event DataD2 of "write" received from the event sending section 105 to the external output of the simulator.

In the simulation model according to the second embodiment, the arbitration section 109 sends the transmission authorization to the destination to the control event with the higher priority among those transmitted from the CP1 model 102a and the CP2 model 102b. The arbitration section 109 does not send the transmission authorization to the control event with the lower priority until all the input/output operations of the event with the higher priority are finished. The simulation model according to the second embodiment allows simulation of the hardware 20 operation in the case where the conflict occurs on the bus 11a. The method for obtaining the time information upon simulation of the data writing process will be described hereinafter.

FIG. 14 is a timing chart illustrating the simulation model operation in the data writing process. Referring to FIG. 14, the time information Δtw1 to Δtw7 with respect to the input/output between the CPU 1 and the memory controller 13b will be designated as the time information Δtw1 (C1) to Δtw7 (C1), respectively. The time information Δtw1 to Δtw7 with respect to the input/output between the CPU 2 and the memory controller 13b will be designated as the time information Δtw1 (C2) to Δtw7 (C2), respectively. FIG. 15 is a table depicting factors based on which each time of the Δtw1 to Δtw7 is determined in the data writing process. The detailed explanation will be described hereinafter.

The CPU2 model 102b transmits the request event REQ2 to which the priority information is added to the bus model 101.

In the bus model 101, upon reception of the request event REQ2 from the event reception section 104, the control timing handling section 106b transmits the transmission authorization request event RA2 and the priority information "2" to the arbitration section 109. At this stage, the arbitration section 109 has not received any event from the other control timing handling section 106a, and then transmits the return value of "true" indicating permission of the transmission authorization to the control timing handling section 106b. Upon reception of the return value of "true" from the arbitration section 109, the control timing handling section 106b transmits the time information Δtw1 (C2) to the memory model 103 via the event sending section 105 together with the request event REQ 2. The time information Δtw1 (C2) corresponds to the stand-by period waiting until the CPU 2 transmits the request signal in the hardware 20, and changes depending on presence/absence of conflict on the bus. However, it is possible to assume that no conflict has occurred on the bus. Accordingly, the time information Δtw1 (C2) is set to the fixed value preliminarily set through the experiment likewise the time information Δtw1 as depicted in FIG. 5.

Upon reception of the request event REQ2 and the time information Δtw1 (C2) from the bus model 101, the memory model 103 transmits the response event ACK2 to the bus model 101. The memory model 103 transmits the response event ACK2 and the time information ΔC2t1_2 obtained by adding the time information Δtw2 (C2) to the time information Δtw1 (C2) to the bus model 101. Likewise the time information Δtw2 depicted in FIG. 5, the time information Δtw2 (C2) corresponds to the process period from the time when the memory controller 13b receives the request signal until the preparation for transmitting the response signal is finished in the hardware 20. It is set to the fixed value preliminarily set through the experiment. In the bus model 101, the event sending section 105 transmits the response event ACK2 and the time information ΔC2t1_2 to the control timing handling section 106b.

The CPU1 model 102a transmits the request event REQ1 to which the priority information is added to the bus model 101 for the period from the time when the control timing handling section 106b transmits the data writing request event REQ2 until reception of the response event ACK2.

In the bus model 101, upon reception of the request event REQ1 from the event reception section 104, the control timing handling section 106a transmits the transmission authorization request event RA1 and the priority information "1" to the arbitration section 109. The arbitration section 109 has already sent the transmission authorization to the control timing handling section 106b, and does not permit the transmission authorization to the control timing handling section 106a. The aforementioned state corresponds to the one where the CPU 2 has received the transmission authorization is sent to the CPU 2 in the hardware 20 as depicted in FIG. 14.

Thereafter, upon reception of the response event ACK 2 from the event sending section 105, the control timing handling section 106b transmits the transmission authorization request event RA2 to the arbitration section 109.

The arbitration section 109 which has received the transmission authorization request events RA1 and RA2 permits the transmission authorization to the control timing handling section 106a which passes the control event with the higher priority. The arbitration section 109 does not send permission of the transmission authorization to the control timing handling section 106b which passes the control event with the lower priority until the end of the input/output of the control event and the data size information event between the CPU1 model 102a and the memory model 103. This means that permission of the transmission authorization has been switched from the CPU 2 to the CPU 1 in the hardware 20 as depicted in FIG. 14. In the state where the REQ is sent, and the replacement of the thread is allowed in the middle of the process by performing transaction modeling with respect to the control timing model and the data timing model separately as described above.

Upon reception of the transmission permission from the arbitration section 109, the control timing handling section 106a transmits the time information $\Delta tw1$ (C1) to the memory model 103 via the event sending section 105 together with the request event REQ1. The time information $\Delta tw1$ (C1) corresponds to the stand-by period waiting until the CPU 1 transmits the request signal in the hardware 20, and changes depending on presence/absence of conflict on the bus. At this time, the time information $\Delta tw1$ is obtained by subtracting the time information $\Delta tw0$ (C1) from the time information $\Delta tw2$ (C2). The time information $\Delta tw0$ (C1) corresponds to the period from the time when the CPU 2 transmits the request signal to the memory controller 11b until the CPU 1 transmits the signal indicating the transmission authorization request to the arbitration circuit 11b. The time information $\Delta tw0$ (C1) is allowed to be changed in accordance with the timing at which the REQ1 with higher priority is passed to the bus model 101.

Upon reception of the request event REQ1 and the time information $\Delta tw1$ (C1) from the bus model 101, the memory model 103 transmits the response event ACK1 to the bus model 101. The memory model 103 transmits the response event ACK1 and the time information $\Delta C1t1\_2$ obtained by adding the time information $\Delta tw2$ (C1) to the time information $\Delta tw1$ (C1) to the bus model 101. The time information $\Delta tw2$ corresponds to the process period from the time when the memory controller 13b receives the request signal until the end of the preparation for transmitting the response signal, and set to the fixed value preliminarily determined through the experiment.

In the bus model 101, upon reception of the response event ACK1 and the time information $\Delta C1t1\_2$, the control timing handling section 106a transmits the transmission authorization request RA1 to the arbitration section 109 to obtain permission of the transmission authorization. Upon reception of transmission permission from the arbitration section 109, the control timing handling section 106a transmits the time information $\Delta C1t1\_3$ obtained by adding the time information $\Delta tw3$ (C1) to the time information $\Delta C1t1\_2$ to the CPU1 model 102a via the event sending section 105 together with the response event ACK 1. The time information $\Delta tw3$ (C1) corresponds to the stand-by period waiting until the memory controller 13b transmits the response signal to the CPU 1 in the hardware 20, and changes depending on presence/absence of conflict on the bus. As described above, the event to be passed by the control timing handling section 106a has the priority higher than that of the event to be passed by the control timing handling section 106b. Accordingly the time information $\Delta tw3$ (C1) is set to the fixed value preliminarily set through the experiment likewise the time information $\Delta tw3$ as depicted in FIG. 5.

Upon reception of the response event ACK1 and the time information $\Delta C1t1\_3$ from the bus model 101, the CPU1 model 102a transmits the data size information event DataS1 to the bus model 101. The CPU1 model 102a transmits the time information $\Delta C1t1\_4$ obtained by adding the time information $\Delta tw4$ (C1) to the time information $\Delta C1t1\_3$ to the bus model 101 together with the data size information event DataS1. The time information $\Delta tw4$ (C1) corresponds to the process period from the time when the CPU1 receives the response signal until the data signal which contains data is transmitted in the hardware 20 likewise the case of the time information $\Delta tw4$ depicted in FIG. 5. For example, the time information $\Delta tw4$ (C1) corresponds to the sum of the time for the CPU 1 to prepare the data signal and the time for outputting the data signal which contains data to the bus 11a. The time information $\Delta tw4$ (C1) is obtained by multiplying the process time per data by the data size information. The process period per data is set to the fixed value preliminarily set through the experiment.

In the bus model 101, the data timing handling section 107 transmits the data size information event DataS1 received from the CPU model 102, and the time information $\Delta C1t1\_5$ to the memory model 103 via the event sending section 105. The time information $\Delta C1t1\_5$ is obtained by adding the time information $\Delta tw5$ (C1) to the time information $\Delta C1t1\_4$. Likewise the time information $\Delta tw5$ depicted in FIG. 5, the time information $\Delta tw5$ (C1) corresponds to the period for transmitting the data signal which contains data via the bus 11a in the hardware 20. The time information $\Delta tw5$ is obtained by multiplying the transmission period per data by the data size information. The transmission period per data is set to the fixed value preliminarily set through the experiment.

Upon reception of the data size information event DataS1 and the time information $\Delta C1t1\_5$ from the bus model 101, the memory model 103 transmits the EOD1 event to the bus model 101. The memory model 103 transmits the time information $\Delta C1t1\_6$ obtained by adding the time information $\Delta tw6$ (C1) to the time information $\Delta C1t1\_5$ to the bus model 101 together with the EOD1 event. The time information $\Delta tw6$ (C1) corresponds to the process period for the data to be written into the memory 13a in the hardware 20 likewise the time information $\Delta tw6$ depicted in FIG. 5. For example, the time information $\Delta tw6$ (C1) is obtained by multiplying the memory writing period per data by the data size information. The memory writing period per data is set to the fixed value preliminarily set through the experiment.

In the bus model 101, upon reception of the EOD1 event and the time information $\Delta C1t1\_6$ from the memory model 103, the data timing handling section 107 sends the notification with respect to return of the transmission authorization to the arbitration section 109. Then the data timing handling section 107 transmits the EOD event and the time information $\Delta C1t1\_7$ obtained by adding the time information $\Delta tw7$ (C1) to the time information $\Delta C1t1\_6$ to the CPU model 102 via the event reception section 104. The time information $\Delta tw7$ (C1) corresponds to the transmission period for transmitting the process end signal via the bus 11a in the hardware 20 likewise the time information $\Delta tw7$ depicted in FIG. 5. The time information $\Delta tw7$ is set to the fixed value preliminarily set through the experiment. The thus obtained time information $\Delta C1tw1\_7$ corresponds to the period from the time when the CPU 1 outputs the data writing request until the process end signal is obtained.

Upon reception of the notification with respect to return of the transmission authorization from the data timing handling section 107, the arbitration section 109 sends the transmission authorization to the control timing process section 106b for resuming the process performed thereby. This means that the transmission authorization has been switched from the CPU 1 to the CPU 2 in the hardware 20 as depicted in FIG. 14.

Upon reception of the transmission authorization from the arbitration section 109, the control timing handling section 106b transmits the response event ACK2 and the time information $\Delta C2t1\_3$ obtained by adding the time information $\Delta tw3$ (C2) to the time information $\Delta C2t1\_2$ to the CPU2 model 102b via the event sending section 105. The time information $\Delta tw3$ (C2) corresponds to the stand-by period waiting until the memory controller 13b transmits the response signal to the CPU 2 in the hardware 20, and changes depending on presence/absence of conflict on the bus. For example, the time information Δtw3 (C2) is obtained by summing the Δtw2 (C1), Δtw3 (C1), Δtw4 (C1), Δtw5 (C1), Δtw6 (C1) and Δtw7 (C1). That is, in the simulation model according to the second embodiment, the transmission stand-by period for the control signal with the lower priority is obtained as the sum of the time information with respect to the control signal and the data signal each having the higher priority, which are passed while the control signal with the lower priority is kept stand-by.

Upon reception of the response event ACK2 and the time information $\Delta C2t1\_3$ from the bus model 101, the CPU2 model 102b transmits the data size information event DataS2 to the bus model 101. The CPU2 model 102b transmits the data size information event DataS2 and the time information $\Delta C2t1\_4$ obtained by adding the time information Δtw4 (C2) to the time information $\Delta C2t1\_3$ to the bus model 101. The time information Δtw4 (C2) corresponds to the process period from the time when the CPU 2 receives the response signal until the data signal which contains data is transmitted in the hardware 20 likewise the time information Δtw4 depicted in FIG. 5. For example, the time information Δtw4 (C2) corresponds to the sum total of the time for the CPU 2 to prepare the data signal and the time for the CPU 2 to output the data signal to the bus 11a. The time information Δtw4 (C2) is obtained by multiplying the process period per data by the data size information. The process period per data is set to the fixed value preliminarily set through the experiment.

In the bus model 101, the data timing handling section 107 transmits the data size information event DataS2 received from the CPU model 102 and the time information $\Delta C2t1\_5$ obtained by adding the time information Δtw5 (C2) to the time information $\Delta C2t1\_4$ to the memory model 103 via the event sending section 105. The time information Δtw5 (C2) corresponds to the period for transmitting the data signal via the bus 11a in the hardware 20 likewise the time information Δtw5 depicted in FIG. 5. The time information Δtw5 is obtained by multiplying the transmission period per data by the data size information. The transmission period per data is set to the fixed value preliminarily set through the experiment.

Upon reception of the data size information event DataS2 and the time information $\Delta C2t1\_5$ from the bus model 101, the memory model 103 transmits the EOD2 event to the bus model 101. The memory model 103 transmits the EOD 2 event and the time information $\Delta C2t1\_6$ obtained by adding the time information Δtw6 (C2) to the time information $\Delta C2t1\_5$ to the bus model 101. The time information Δtw6 (C2) corresponds to the process period for writing data into the memory 13a in the hardware 20 likewise the time information Δtw6 depicted in FIG. 5. For example, the memory model 103 obtains the time information Δtw6 (C2) by multiplying the writing period into the memory per data by the data size information. The memory writing period per data is set to the fixed value preliminarily set through the experiment.

In the bus model 101, upon reception of the EOD event and the time information $\Delta C2t1\_6$ from the memory model 103, the data timing handling section 107 sends the notification with respect to return of the transmission authorization to the arbitration section 109. The data timing handling section 107 transmits the EOD event and the time information $\Delta C2t1\_7$ obtained by adding the time information Δtw7 (C2) to the time information $\Delta C2t1\_6$ to the CPU model 102 via the event reception section 104. The time information Δtw7 (C2) corresponds to the period for transmitting the process end signal via the bus 11a in the hardware 20 likewise the time information Δtw7 depicted in FIG. 5. The time information Δtw7 is set to the fixed value preliminarily set through the experiment. The thus obtained time information $\Delta C2tw1\_7$ corresponds to the period from the time when the CPU 2 outputs the data writing request until the process end signal is obtained.

In the simulation model according to the second embodiment, among the control events transmitted from the CPU1 model 102a and the CPU2 model 102b, the transmission authorization to the destination is given to the control event with the higher priority. The transmission authorization is not given to the control event with the lower priority until the end of all the input/output operations for the control event with the higher priority and the data size information event in accordance with the control event. This makes it possible to simulate the state where conflict occurs on the bus owing to connection of the two CPUs 1 and 2 to the bus 11a.

In the simulation model according to the second embodiment, the sum total of the time information obtained by inputting/outputting the control event with the higher priority and the data size information event in accordance with the control event is calculated for the stand-by period of the control event with the lower priority waiting for transmission. This makes it possible to obtain the stand-by period information with respect to the control event with the lower priority. The simulation model according to the second embodiment provides the time information $\Delta C1tw1\_7$ and $\Delta C2tw1\_7$ with respect to the period from the time when the CPU1 and CPU2 output the respective data writing requests until the process end signal is obtained.

The simulation model according to the second embodiment has been described as the example for simulating the process for writing data into the memory. However, the present invention is not limited to the structure as described above. The use of the aforementioned method allows simulation with respect to the state where conflict occurs on the bus upon simulation of the data reading process from the memory.

The simulation model according to the second embodiment has been described as the example for simulating the state where two CPUs 1 and 2 are connected to the bus 11a. However, the present invention is not limited to the structure as described above. The aforementioned method may be employed in the case where three or more CPUs are connected to the bus. In the aforementioned case, the arbitration section gives the transmission authorization to the destination in the order of the control event with the highest priority. For example, the arbitration section does not give the transmission authorization to the desired control event until the end of input/output of the control event with the priority higher than that of the desired control event, and the data size information event in accordance with the control event. While the desired control event is in the stand-by state for transmission, the sum total of the time information obtained by inputting/outputting the control event with priority higher than that of the desired control event and the data size information event in accordance with the control event will be calculated. The calculated sum of the time information becomes the stand-by period information with respect to the arbitrary control event.

In the real chip, the conflict occurs with high frequency. The precision derived from the aforementioned embodiments may be improved compared with the generally employed simulation for simulating the case where no conflict occurs in the real chip.

Modified Example

The embodiments depict the example for simulating input/output operations of the control signal and the data signal between the CPU and the memory controller. It is clearly understood that the function block is not limited to the CPU and the memory controller. For example, the aforementioned embodiments are applicable to the case for simulating input/output operations of the control signal and the data signal between the DMA controller and the memory controller. In other words, the method described in the embodiments is applicable to the case for simulating input/output operations of the control signal and the data signal between plural function blocks serving as master and slave, respectively besides the CPU and the memory controller.

Figure 16:
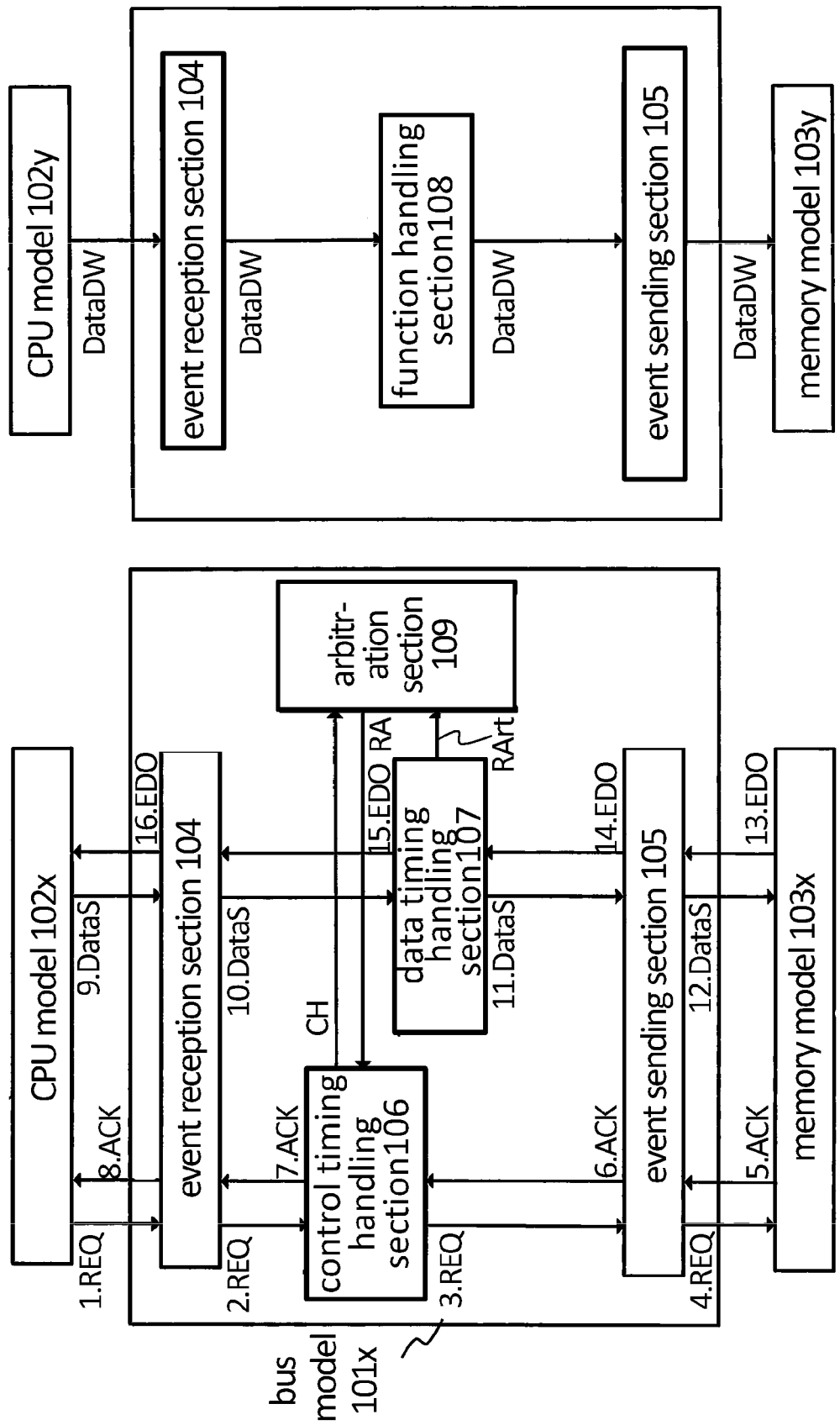
FIG. 16 is a block diagram depicting an example of a structure of a simulation model according to a modified example.

FIG. 16 is a block diagram depicting an example of a structure of a simulation model as a modified example.

As has been clarified by the explanations of the first embodiment depicted in FIGS. 3 and 7, and the second embodiment depicted in FIG. 12, the function process portion in the bus model operates independently from the control timing handling section and the data timing handling section. The simulation model may be separated into the control timing model, data timing model and the function timing model so as to be executed separately. For example, the program of the simulation model may be separated into the thread where the control timing model and the data timing model are executed, and the thread where the function model is executed.

FIG. 16 illustrates an example of the structure of the simulation model depicted in FIG. 3, which is separated into a thread having the control timing model and the data timing model executed, and a thread having the function model extended.

The simulation model including a CPU model 102x, a bus model 101x, and a memory model 103x executes the control timing model and the data timing model. The bus model 101x includes the control timing handling section 106, the data timing handling section 107, and the arbitration section 109. The control event and the data size information event are input/output between the CPU model 102x and the memory model 103x via the bus model 101x. The simulation model which includes a CPU model 102y, a bus model 101y, and a memory model 103y executes the function model. The bus model 101y has the function handling section 108. The data information events are input/output via the bus model 101y between the CPU model 102y and the memory model 103y. The respective two simulation models are operated separately as the respective threads to execute the control timing model and the data timing model, and the function model in parallel with one another. It is possible to reduce the entire execution period of the simulation model as a whole.

All examples and conditional language recited herein are intended for pedagogical purposes to aid the reader in understanding the invention and the concepts contributed by the inventor to furthering the art, and are to be construed as being without limitation to such For example recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. A performance evaluation device including a simulation unit evaluating a hardware including a processor, a data handling device and a BUS that connects the processor and the data handling device, the evaluating performed by a simulation using the simulation unit including a processor unit representing the processor, a BUS unit representing the BUS and a data handling device unit representing a data handling device comprising:
    a control timing model unit configured to control a first timing of inputting/outputting a first control signal between the processor unit and the data handling device unit, the first control signal being used for a request of a data handling process to the data handling device unit and an acknowledgment of the data handling process from the data handling device unit;
    a control signal transfer period calculation unit configured to calculate a transfer period of the first control signal between the processor unit and the data handling device unit, where a control signal transfer period is calculated from a time when a request of the data handling process is made to the data handling device to a time when the acknowledgment of the data handling process is made by the data handling device;
    a data timing model unit configured to control a second timing of inputting/outputting a second control signal between the processor unit and the data handling device unit, the second control signal being used for at least one of informing a data size to the data handling device unit and informing an end of the data handling process from the data handling device unit; and
    a data signal transfer period calculation unit configured to calculate a transfer period of the second control signal between the processor unit and the data handling device unit in accordance with the second timing, where a data signal transfer period is calculated from a time when the data handling device is informed of the data size to a time when the data handling process is ended.

2. The performance evaluation device according to claim 1, comprising:
    a control signal process time calculation unit configured to calculate time information indicating a process period of the first control signal in the data handling device unit.

3. The performance evaluation device according to claim 1, comprising:
    a data signal process time calculation unit configured to calculate time information indicating a process period of the second control signal in the data handling device unit.

4. The performance evaluation device according to claim 3, wherein:
    the data signal transfer period calculation unit calculates a time information indicating a transmission period of the second control signal by multiplying a transmission period per data by the data size; and
    the data signal process time calculation unit calculates a time information indicating a process period of the second control signal by multiplying a process period per data with the data size.

5. The performance evaluation device according to claim 1, wherein:
    the control timing model unit controls a control event according to the first control signal between the processor unit and the data handling unit via the bus unit; and
    the data timing model unit controls a data event according to the second control signal between the processor unit and the data handling unit via the bus unit.

6. The performance evaluation device according to claim 5, wherein:
    the bus unit includes an arbitration unit formed by an arbitration circuit to adjust a conflict between a plurality of the first control signals on the bus; and the arbitration unit permits transmission of the control event received by the bus unit to a destination after an operation according to another control event with a priority higher than that of the control event is finished.

7. The performance evaluation device according to claim 6, wherein the control signal transfer period calculation unit calculates a sum of time information with respect to the first control signal and the second signal when the first control signal is in a stand-by state for transmission as the time information indicating the stand-by period of the first control signal.

8. The performance evaluation device according to claim 1, wherein the control timing model unit and the data timing model unit are executed in parallel with each other.

9. A computer readable, non transitory, recording medium having stored therein a program causing a computer in a performance evaluation device to execute a process to evaluate a hardware including a processor, a data handling device, and a Bus, the process comprising:

controlling a first timing of inputting/outputting a first control signal between a simulated processor and a simulated data handling device, the first control signal being used for a request of a data handling process to the simulated data handling device and an acknowledgment of the data handling process from the simulated data handling device;

calculating a transfer period of the first control signal between the simulated processor and the simulated data handling device in accordance with the first timing, where a control signal transfer period is calculated from a time when a request of the data handling process is made to the data handling device to a time when the acknowledgment of the data handling process is made by the data handling device;

controlling a second timing of inputting/outputting a second control signal between the simulated processor and the simulated data handling device, the second control signal being used for at least one of informing a data size to the simulated data handling device and informing an end of the data handling process from the simulated data handling device; and calculating a transfer period of the second control signal between the simulated processor and the simulated data handling device in accordance with the second timing, where a data signal transfer period is calculated from a time when the data handling device is informed of the data size to a time when the data handling process is ended.

10. A performance evaluation method to evaluate a hardware including a processor, a data handling device and a BUS that connects the processor and the data handling device by performing a simulation by using a simulation unit including a processor unit representing the processor, a BUS unit representing the BUS and a data handling device unit representing a data handling device, the performance evaluation method performed by computer comprising:

controlling a first timing of inputting/outputting a first control signal between a processor unit and a data handling unit, the first control signal being used for a request of a data handling process to the data handling device unit and an acknowledgment of the data handling process from the data handling device unit;

calculating a transfer period of the first control signal between the processor unit and data handling device unit in accordance with the first timing, where a control signal transfer period is calculated from a time when a request of the data handling process is made to the data handling unit to a time when the acknowledgment of the data handling process is made by the data handling unit;

controlling a second timing of inputting/outputting a second control signal between the processor unit and the data handling device unit, second control signal being used for at least one of informing a data size to the data handling device unit and informing an end of the data handling process from the data handling device unit; and calculating the transfer period of the second control signal between the processor unit and the data handling device unit in accordance with the second timing, where a data signal transfer period is calculated from a time when the data handling unit is informed of the data size to a time when the data handling process is ended.

* * * * *